(12) United States Patent
Gizdarski

(10) Patent No.: US 10,345,369 B2
(45) Date of Patent: Jul. 9, 2019

(54) AUGMENTED POWER-AWARE DECOMPRESSOR

(71) Applicant: Synopsys, Inc., Mountain View, CA (US)

(72) Inventor: Emil Gizdarski, Cupertino, CA (US)

(73) Assignee: Synopsys, Inc., Mountain View, CA (US)

(*) Notice: Subject to any disclaimer, the term of this patent is extended or adjusted under 35 U.S.C. 154(b) by 1105 days.

(21) Appl. No.: 14/044,561

(22) Filed: Oct. 2, 2013

(65) Prior Publication Data

US 2014/0095101 A1    Apr. 3, 2014

Related U.S. Application Data

(60) Provisional application No. 61/708,949, filed on Oct. 2, 2012.

(51) Int. Cl.
  *G01R 31/26* (2014.01)
  *G01R 31/3183* (2006.01)
  *G01R 31/3185* (2006.01)

(52) U.S. Cl.
  CPC ..... *G01R 31/26* (2013.01); *G01R 31/318335* (2013.01); *G01R 31/318547* (2013.01)

(58) Field of Classification Search
  CPC .................................................. G01R 31/26
  USPC ........................................................ 702/120
  See application file for complete search history.

(56) References Cited

U.S. PATENT DOCUMENTS

| | | | |
|---|---|---|---|
| 3,784,907 A | 1/1974 | Eichelberger | |
| 4,495,629 A | 1/1985 | Zasio et al. | |
| 4,503,537 A | 3/1985 | McAnney | |
| 5,790,562 A | 8/1998 | Murray et al. | |
| 6,158,032 A * | 12/2000 | Currier | G01R 31/318536 324/73.1 |
| 6,327,687 B1 | 12/2001 | Rajski et al. | |
| 6,557,129 B1 | 4/2003 | Rajski et al. | |
| 6,615,380 B1 | 9/2003 | Kapur et al. | |
| 6,684,109 B1 | 1/2004 | Osypka | |
| 6,701,505 B1 | 3/2004 | Srinivasan | |
| 6,708,192 B2 * | 3/2004 | Rajski | G06F 7/584 708/252 |
| 6,738,939 B2 | 5/2004 | Udawatta et al. | |
| 6,745,359 B2 | 6/2004 | Nadeau-Dostie | |
| 6,748,564 B1 | 6/2004 | Cullen et al. | |
| 6,782,501 B2 | 8/2004 | Distler et al. | |
| 6,807,646 B1 | 10/2004 | Williams et al. | |
| 6,829,740 B2 | 12/2004 | Rajski et al. | |

(Continued)

OTHER PUBLICATIONS

C.V. Krishna and Nur A. Touba, "Adjustable Width Linear Combinational Scan Vector Decompression", Nov. 11-13, 2003, ICCAD '03, 2003ACM, pp. 863-866.*

(Continued)

*Primary Examiner* — Gregory J Toatley, Jr.
*Assistant Examiner* — Douglas Kay
(74) *Attorney, Agent, or Firm* — Haynes Beffel & Wolfeld LLP

(57) ABSTRACT

Decompressor circuitry includes a first segment and a second segment each comprising memory elements (MEs) and (i) said first segment receives the plurality of static variables originating from the tester, and (ii) and said second segment, receives the plurality of dynamic variables originating from the tester.

40 Claims, 11 Drawing Sheets

(56) References Cited

U.S. PATENT DOCUMENTS

| | | | |
|---|---|---|---|
| 6,874,109 B1* | 3/2005 | Rajski | G01R 31/31813 714/726 |
| 6,877,119 B2 | 4/2005 | Lauga et al. | |
| 7,058,869 B2 | 6/2006 | Abdel-Hafez et al. | |
| 7,111,209 B2 | 9/2006 | Rajski et al. | |
| 7,155,648 B2 | 12/2006 | Jas et al. | |
| 7,231,570 B2 | 6/2007 | Wang et al. | |
| 7,278,075 B2 | 10/2007 | Onodera | |
| 7,278,123 B2 | 10/2007 | Ravi et al. | |
| 7,370,254 B2* | 5/2008 | Rajski | G01R 31/318566 714/726 |
| 7,415,678 B2 | 8/2008 | Gizdarski | |
| 7,487,420 B2 | 2/2009 | Keller | |
| 7,500,163 B2 | 3/2009 | Rajski et al. | |
| 7,509,550 B2 | 3/2009 | Rajski et al. | |
| 7,584,392 B2 | 9/2009 | Bhatia | |
| 7,590,905 B2 | 9/2009 | Abdel-Hafez et al. | |
| 7,716,548 B2 | 5/2010 | Cheng et al. | |
| 7,729,884 B2 | 6/2010 | Huang et al. | |
| 7,743,302 B2* | 6/2010 | Rajski | G01R 31/318566 714/729 |
| 7,882,409 B2 | 2/2011 | Gizdarski | |
| 7,890,827 B2* | 2/2011 | Rajski | G01R 31/318566 714/726 |
| 7,925,465 B2 | 4/2011 | Lin et al. | |
| 7,925,947 B1 | 4/2011 | Touba et al. | |
| 7,937,634 B2 | 5/2011 | Almukhaizim et al. | |
| 7,949,269 B2 | 5/2011 | Takeuchi | |
| 7,949,921 B2 | 5/2011 | Gizdarski | |
| 7,956,772 B2 | 6/2011 | Shokrollahi et al. | |
| 7,962,822 B2 | 6/2011 | Wen et al. | |
| 7,996,741 B2 | 8/2011 | Touba et al. | |
| 8,046,653 B2* | 10/2011 | Rajski | G01R 31/318335 714/732 |
| 8,103,926 B2 | 1/2012 | Gizdarski | |
| 8,166,359 B2 | 4/2012 | Rajski et al. | |
| 8,290,738 B2 | 10/2012 | Lin et al. | |
| 8,301,945 B2* | 10/2012 | Rajski | G01R 31/318335 714/729 |
| 8,407,541 B1 | 3/2013 | Teh et al. | |
| 8,499,209 B2* | 7/2013 | Rajski | G01R 31/318547 714/741 |
| 8,566,656 B2 | 10/2013 | Zivkovic et al. | |
| 8,707,227 B2 | 4/2014 | Gizdarski | |
| 8,898,529 B2 | 11/2014 | Goessel et al. | |
| 8,914,695 B2 | 12/2014 | Gizdarski | |
| 8,914,965 B2 | 12/2014 | Shibata et al. | |
| 9,088,522 B2 | 7/2015 | Rajski et al. | |
| 9,134,378 B2 | 9/2015 | Gizdarski | |
| 9,702,934 B1* | 7/2017 | Meehl | G01R 31/318335 |
| 10,120,029 B2 | 11/2018 | Rajski et al. | |
| 2002/0093356 A1 | 7/2002 | Williams et al. | |
| 2003/0056164 A1 | 3/2003 | Lauga | |
| 2004/0139377 A1 | 7/2004 | Barnhart et al. | |
| 2004/0148554 A1 | 7/2004 | Dervisoglu et al. | |
| 2004/0230884 A1* | 11/2004 | Rajski | G01R 31/318566 714/742 |
| 2005/0055617 A1 | 3/2005 | Wang et al. | |
| 2005/0060625 A1 | 3/2005 | Wang et al. | |
| 2005/0097413 A1 | 5/2005 | Ravi et al. | |
| 2005/0138509 A1 | 6/2005 | Kiryu et al. | |
| 2005/0229123 A1 | 10/2005 | Wang et al. | |
| 2007/0113135 A1 | 5/2007 | Rajski et al. | |
| 2007/0234157 A1 | 10/2007 | Rajski et al. | |
| 2008/0133987 A1* | 6/2008 | Rajski | G01R 31/318566 714/719 |
| 2008/0294953 A1 | 11/2008 | Cheng et al. | |
| 2009/0259900 A1 | 10/2009 | Rajski et al. | |
| 2009/0300446 A1* | 12/2009 | Rajski | G01R 31/318547 714/726 |
| 2010/0205492 A1* | 8/2010 | Sinanoglu | G01B 31/318335 714/729 |
| 2010/0229060 A1* | 9/2010 | Mrugalski | G01R 31/318547 714/738 |
| 2010/0257417 A1* | 10/2010 | Rajski | G01R 31/318566 714/731 |
| 2010/0306609 A1 | 12/2010 | Rajski et al. | |
| 2011/0258503 A1 | 10/2011 | Wohl et al. | |
| 2012/0239995 A1 | 9/2012 | Gizdarski | |
| 2012/0311009 A1 | 12/2012 | Jarrett et al. | |
| 2014/0095101 A1 | 4/2014 | Gizdarski | |
| 2015/0323597 A1 | 11/2015 | Rajski et al. | |

OTHER PUBLICATIONS

Kedarnath J. Balakrishnan and Nur A. Touba, "Reconfigurable Linear Decompressors Using Symbolic Gaussian Elimination", (DATE'05), Proceedings of the Design, Automation and Test in Europe Conference and Exhibition.*

Rohit Kapur & Robert Ruiz, "DFTMAX™ Compression Backgrounder", Fall, 2009, Technical Backgrounder, Synopsys.*

Nur Touba "Survey of Test Vector Compression Techniques", 2006, IEEE Design & Test of Computers, vol. 23, No. 4, pp. 294-303.

Janusz Rajski et al., "Embedded Deterministic Test," IEEE Transactions on Computer-Aided Design of Integrated Circuits and Systems, vol. 23, No. 5, May 2004, pp. 776-792.

Dongsoo Lee et al., "Viterbi-Based Efficient Test Data Compression" IEEE Transactions on Computer-Aided Design of Integrated Circuits and Systems, vol. 31, No. 4, Apr. 2012, pp. 610-619.

Samitha Samaranayake et al., "A Reconfigurable Shared Scan-In Architecture" Proceedings of the 21st IEEE VLSI Test Symposium, 2003, consisting of 6 pages.

Wohl et al. "X-Tolerant Compression and Application of Scan-ATPG Patterns in a BIST Architecture" IEEE ITC International Test Conference 2003, pp. 727-736.

Sitchinava et al. "Changing the Scan Enable During Shift" Proceedings of the 22nd IEEE VLSI Test Symposium 2004, consisting of 6 pages.

Mitra et al. "X-Compact: An Efficient Response Compaction Technique", IEEE Transactions on Computer-Aided Design of Integrated Circuits and Systems, vol. 23, No. 3, Mar. 2004, pp. 421-432.

Hakmi et al. "Implementing a Scheme for External Deterministic Self-Test" VLSI Test Symposium, 2005, Proceedings 23rd IEEE, May 1-5, 2005, pp. 101-106.

Reddy et al. "A Data Compression Technique for Built-In Self-Test" IEEE Transactions on Computers, vol. 37, No. 9, Sep. 1988, pp. 1151-1156.

Mitra et al. "X-Compact an Efficient Response Compaction Technique for Test Cost Reduction", ITC International Test Conference, 2002, pp. 311-320.

Chickermane et al. "Channel Masking Synthesis for Efficient On-Chip Test Compression" IEEE ITC International Test Conference 2004, pp. 452-461.

Wohl et al. "Analysis and Design of Optimal Combinational Compactors" Proceedings of the 21st IEEE VLSI Test Symposium, 2003, consisting of 6 pages.

Patel et al. "Application of Saluja-Karpovsky Compactors to Test Responses with Many Unknowns", Proceedings of the 21st IEEE VLSI Test Symposium 2003, consisting of 6 pgs.

Rajski et al. "Convolutional Compaction of Test Responses" IEEE ITC International Test Conference, 2003, pp. 745-754.

Rajski et al. "Synthesis of X-Tolerant Convolutional Compactors" Proceedings of the 23rd IEEE VLSI Test Symposium, 2005, consisting of 6 pages.

Saluja et al. "Testing Computer Hardware Through Data Compression in Space and Time" IEEE International Test Conference 1983, pp. 83-88.

David "Testing by Feedback Shift Register" IEEE Transactions on Computers, vol. C-29, No. 7, Jul. 1980, pp. 668-673.

Keller—Cadence Design Systems "An Overview of On-Chip Compression Architectures" EDN (Electronics, Design, Strategy, News) Sep. 1, 2006, pp. 61-68.

Smith, "Easily Decodable Efficient Self-Orthogonal Block Codes" IEEE, Electronic Letters Mar. 31, 1977, vol. 13 No. 7, pp. 173-174.

Cheng et al. "Compactor Independent Direct Diagnosis" Proceedings of the 13th Asian Test Symposium (ATS 2004), 6 pages.

(56) References Cited

OTHER PUBLICATIONS

Rajski et al. "Modular Compactor of Test Responses" Proceedings of the 24th IEEE VLSI Test Symposium (VTS 2006), 10 pages.

Wohl et al. "Fully X-Tolerant Combinational Scan Compression" International Test Conference IEEE 2007, pp. 1-10.

Gizdarski "Constructing Augmented Multimode Compactors" In: 26th IEEE VLSI Test Symposium, Apr. 2008, pp. 29-34.

PCT/US2009/055541—International Search Report and Written Opinion dated Apr. 1, 2010, 7 pages.

Rajski et al., "X-Tolerant Compactor With On-Chip Registration and Sig Nature-Based Diagnosis," IEEE Design & Test of Computers, Sep.-Oct. 2007, vol. 24, Issue 5, pp. 476-485.

Wohl et al., "Scalable Selector Architecture for X-Tolerant Deterministic BIST", DAC, Jun. 7-11, 2004, San Diego CA., pp. 934-939.

Han et al. "Response Compaction for Test Time and Test Pins Reduction Based on Advanced Convolutional Codes" Proceedings of the 19th IEEE International Symposium on Defect and Fault Tolerance in VLSI Systems 2004, 8 pages.

U.S. Appl. No. 14/954,391—Office Action dated Aug. 10, 2017, 20 pages.

Gizdarski, "Two-Step Dynamic Encoding for Linear Decompressors," 2014 IEEE 23rd Asian Test Symposium, Nov. 16-19, 2014, pp. 330-335.

Krishna et al., "Test Vector Encoding Using Partial LFSR Reseeding," ITC Int'l Test Conference, Paper 31.3, 2001 IEEE, pp. 885-893.

U.S. Appl. No. 14/954,391—Final Office Action dated Apr. 19, 2018, 11 pages.

U.S. Appl. No. 14/954,391—Office Action dated Nov. 14, 2018, 7 pages.

* cited by examiner

Scheme A

Scheme B

Scheme C

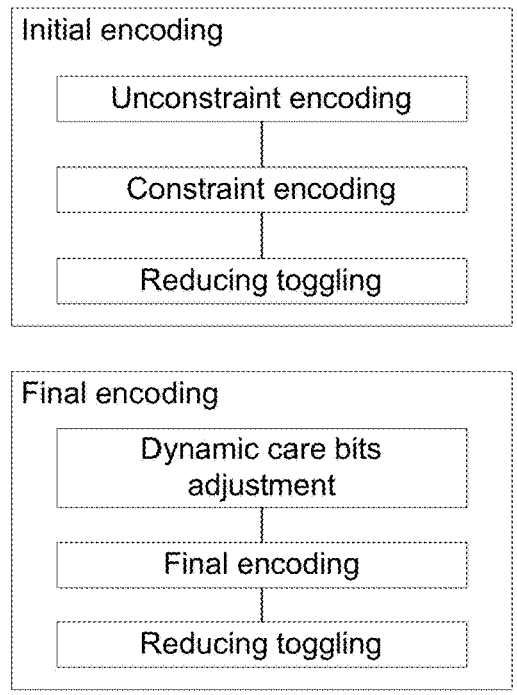
FIG. 14
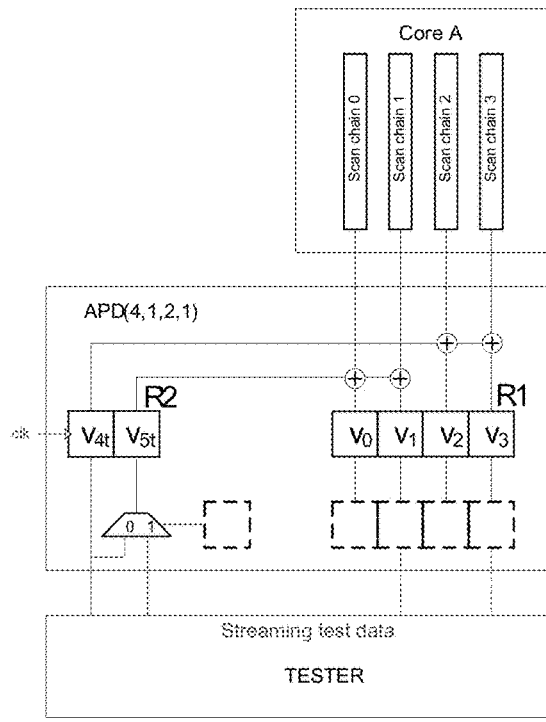
FIG. 15: An interface between the APD and the tester

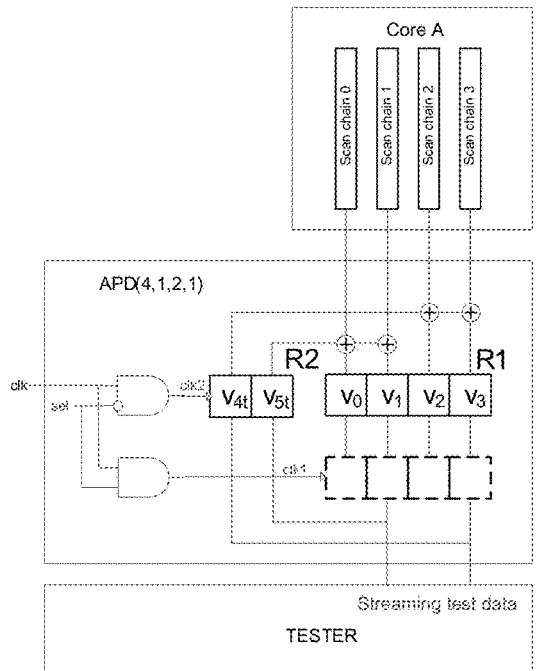
FIG. 16
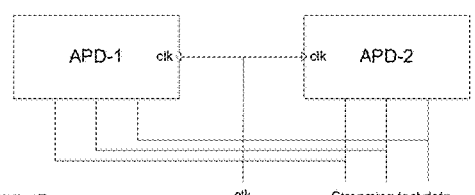
FIG. 17a scheme A1
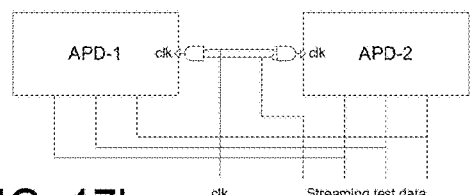
FIG. 17b scheme A2
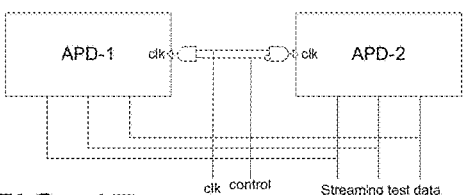
FIG. 17c scheme B1
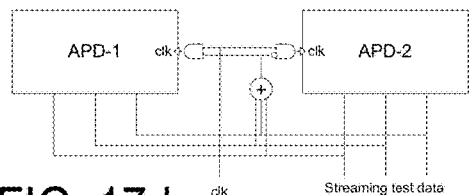
FIG. 17d scheme B2
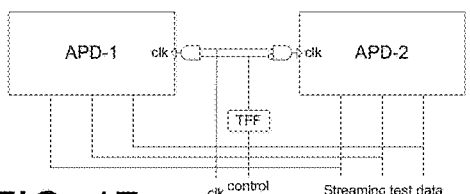
FIG. 17e scheme C1
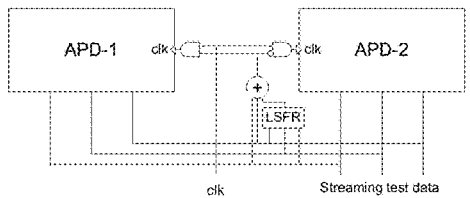
FIG. 17f scheme C2

AUGMENTED POWER-AWARE DECOMPRESSOR

REFERENCE TO RELATED APPLICATIONS

This application claims the benefit of U.S. Provisional Application No. 61/708,949 filed on 2 Oct. 2012.

BACKGROUND

Field

The technology relates to electronic design automation in the integrated circuit industry. Various embodiments relate to test data volume and test application time reduction during testing of integrated circuits and more particularly for decompressing test stimuli and minimizing toggling rate in the decompressed test stimuli.

Description of Related Art

Electronic design automation (EDA) is applied in the semiconductor industry for virtually all design projects. After an idea for the product is developed, EDA tools are used to define a specific implementation including lithographic masks for production of the finished chips, in a process referred to as tape-out. The lithographic masks are then used with fabrication equipment to manufacture integrated circuit wafers. Testing and diagnosis are required steps to determine defective dies and defect localization. Next, physical failure analysis is performed to identify root causes for systematic defects which are used for correction of masks, and design and fabrication process improvements in order to increase yield. Finally, the wafers are diced, packaged and assembled to provide integrated circuit chips for distribution.

An exemplary procedure for using EDA tools begins with a design specification of a product to be implemented using the integrated circuit. Next, logic design tools are applied to create a high level description based on description languages such as Verilog or VHDL, and functional verification tools are applied in an iterative process to assure that the high-level description accomplishes the design specification. Next, synthesis and design-for-test tools are used to translate the high-level description to a netlist, optimize the netlist for target technology, and insert test logic that permits testing of the finished chips.

A typical design flow might next include a design planning stage, in which an overall floor plan for the chip is constructed and analyzed to ensure that timing parameters for the netlist can be achieved at a high level. Next, the netlist may be rigorously checked for compliance with timing constraints and with the functional definitions defined at a high level using VHDL or Verilog. After an iterative process to settle on a netlist and map the netlist to a cell library for the final design, a physical implementation tool is used for placement and routing. A tool performing placement positions circuit elements on the layout, and a tool performing routing defines interconnects for the circuit elements.

The components defined after placement and routing are usually then analyzed at the transistor level using an extraction tool, and verified to ensure that the circuit function is achieved and timing constraints are met. The placement and routing process can be revisited as needed in an iterative fashion. Next, the design is subjected to physical verification procedures, such as design rule checking DRC, layout rule checking LRC and layout versus schematic LVS checking, that analyze manufacturability, electrical performance, lithographic parameters, and circuit correctness.

After closure on an acceptable design by iteration through design and verify procedures, like those described above, the resulting design can be subjected to resolution enhancement techniques that provide geometric manipulations of the layout to improve manufacturability. Finally, the mask data is prepared and taped out for use in producing finished products.

This design process with EDA tools includes circuitry that allows the finished product to be tested. Efficient testing of integrated circuits often uses structured design for testability (DFT) techniques. In particular, these techniques are based on the general concepts of making all or some memory elements like flip-flops and latches in the circuit under test (CUT) directly controllable and observable. The most-often used DFT methodology is based on scan chains. This approach assumes that during testing all (or almost all) memory elements are included in shift registers. As a result, the designed logic circuit has two (or more) modes of operation, including at least a functional mode and a test mode. In the functional mode, the memory elements perform their regular functions. In the test mode, the memory elements become scan cells that are connected to form shift registers called scan chains. These scan chains are used to scan-in test stimuli into a CUT and scan-out test responses. Applying a test pattern consists of performing scan-in (loading) the test stimulus, applying one or more capture clocks, and then performing scan-out (unloading) the captured test response. The test responses are then compared to fault-free test responses to determine whether the CUT works properly.

The DFT methodology has been widely used in order to simplify testing and diagnosis. From the point of view of automatic test pattern generation (ATPG), a CUT can be treated as a combinational or partially combinational circuit. Today, ATPG software tools are able to generate a set of test patterns based on different fault models including stuck-at, transition, path delay, and bridging faults. When a particular fault in a CUT is targeted by an ATPG tool, only a small number of scan cells (typically less than 1 percent) is set in particular values (called specified care bits) and one scan cell (an observable point) is observed in order to detect this fault wherein the specified care bits are required to sensitize this fault and propagate the fault effect to the selected observable point. A common approach for test data volume reduction (TDVR) and test application time reduction (TATR) is to use compressed test data rather than storing the entire test stimulus and the entire test response in the tester. A block diagram of an integrated circuit having an on-chip test data compression capability is shown in FIG. 1. Accordingly, a tester is coupled to an integrated circuit comprising a CUT, a decompressor and a compressor. In addition, the CUT may have one or more cores such that each core has an individual decompressor and compressor. Characteristics of decompressor and compressor schemes as well as the routing compressed test data from and to the tester have a major impact on the level of test data compression. Hereafter, the discussion is focused on the decompressor scheme and an encoding process for mapping the specified care bits during ATPG into a pattern such that bits of a decompressed test stimulus which are loaded into the CUT contains all specified care bits.

Prospective decompressor schemes are summarized in FIG. 2. Accordingly, decompression schemes are classified as combinational FIG. 2(a), sequential with limited sequential depth FIG. 2(b) and sequential FIG. 2(c). Combinational decompressors include a combinational block typically comprising XOR and NXOR gates (for linear decompressors) and MUX gates (for non-linear decompressors) such that decompressed test stimulus loaded into scan chains are calculated as a logic function of one or more streaming tester channels. The combinational decompressors have a simple hardware that often support a dynamic encoding wherein the encoding process is incorporated into the ATPG implication process. A challenge for the combinational decompressors is that they encode all specified care bits in one shift cycle using only variables from the tester which are dedicated for this shift cycle. The worst-case, most highly specified shift cycles tend to limit the level of test data compression because when the number of scan chains increases then the number of variables per shift cycle is sufficiently large to encode the most highly specified shift cycles.

Sequential decompressors are usually a linear finite-state machine including one or more shift registers, LFSRs, cellular automata and ring generators. Sequential decompressors allow variables from current and earlier shift cycles to be used for encoding care bits in the current shift cycle. As a result, the sequential decompressors provide more diverse of an output space with less decompressor-imposed constraints than the combinational decompressors. In particular, linear decompressors generate a test sequence comprising a set of specified care bits $\{c_0,c_1, \ldots ,c_{m-1}\}$ which is called also a test cube C if and only if a system of linear equations AV=C has a solution where A is a n×m characteristic matrix of the linear decompressor and $V=\{v_0,v_1, \ldots ,v_{n-1}\}$ is a set of variables from the tester. The characteristic matrix for a linear decompressor is derived by symbolic simulation of the linear decompressor such that each symbol represents one variable. The encoding process for sequential decompressors typically requires solving a system of linear equations including one equation per specified care bit. More formally, the characteristic matrix is a binary matrix (comprising only 1s and 0s) such that each row corresponds to a care bit and each column corresponds to a variable from the tester. The entry in row i and column j in the characteristic matrix has the value 1 if and only if the i-th care bit depends on the j-th variable. After Gauss-Jordan elimination, all linearly independent rows are found. A solution exists if a superposition of sets of linearly dependent rows is equal to 0. If a solution does not exist then the test cube is unencodable. Clearly, it is unlikely to encode test cubes having more specified care bits than the number of available variables from the tester. However, if the number of variables is sufficiently larger than the number of specified care bits then the probability of not finding a solution (or having an encoding conflict) is negligible. The computational complexity of the described encoding process is $O(nm^2)$. As a result, the sequential linear decompressor schemes need to use a static encoding wherein test cubes are first generated, then checked for compatibility and finally encoded. In contrast, the simple decompressor schemes use a dynamic encoding wherein each specified care bit is immediately encoded during branch-and-bound search so that all encoding conflicts are identified and resolved during ATPG. In addition, the simple decompressor schemes allow extracting most of all necessary assignments or implications for a particular test cube (set of care bits) based on the decompressor-imposed constraints that allow an efficient pruning of the branch-and-bound search space.

Routing test data between the tester and a sequential decompressor scheme is based on static or dynamic reseeding. Decompressors based on dynamic reseeding typically receive one seed (or set of static variables having the same scope) per test pattern plus one or more dynamic variables per shift cycle via streaming tester channels wherein both static and dynamic variables are mixed together in the decompressor scheme in order to maximize the encoding flexibility. From a tester standpoint, the dynamic reseeding provides an elegant solution and avoids the need for any special scheduling and synchronization. Decompressor schemes based on dynamic reseeding typically receive a fixed number of test data bits per test pattern which is determined such that both test coverage loss and test pattern inflation are minimized with respect to the conventional scan mode. A challenge for the decompressor schemes using the dynamic reseeding is to maximize TDVR since fewer care bits are required at the end of test pattern set. In contrast, decompressor schemes based on static reseeding typically use multiple seeds per test pattern and seed overlapping. They can selectively encode as many care bits as needed while maintaining a high encoding efficiency (i.e. a ratio of successfully encoded care bits to the deployed bits from the tester). A challenge for the decompressor schemes using the static reseeding is to minimize time overhead because reseeding may delay shift operations.

In addition, the decompressor schemes can use a combination of test data, control data and correlations. In particular, the encoding efficiency of the static and dynamic reseeding cannot exceed the value of 1. The encoding efficiency can be increased above this value using a clustering approach based on the fact that many faults require similar but incompatible test cubes. More formally, test cube clustering uses three test sequences: a parent test sequence and a control test sequence for a cluster of test patterns as well as an incremental test sequence for each test pattern. Accordingly, the test cubes are divided into clusters such that the number of compatible care bits in the test cubes of each cluster is maximized. Next, the parent test sequence is responsible for encoding compatible care bits for each cluster, the incremental test sequence is responsible for encoding the remaining incompatible care bits for each test pattern and the control test sequence determines which test sequence (incremental or parent) is used for a particular care bit and cluster of test patterns. The encoding efficiency of the test cube clustering is improved based on the fact that the control and parent test sequences are the same (or valid) for a cluster of test patterns. A challenge for the decompressor schemes based on the test cube clustering is to reduce the bandwidth between the decompressor and the tester because the parent and control test sequences need to be repeated for each test pattern in a cluster.

Serial shift registers are used to transform serial test data from the tester into parallel test data (or seeds) for the decompressor scheme based on the following facts: 1) tester speed is typically higher than the speed of the scan-in shift operation; and 2) the test costs are estimated by the number of required streaming tester channels per die. As a result, bandwidth of a streaming tester channel is typically improved by a factor of 4, 6 or 8 test data bits per shift cycle.

Last but not least, the decompressor schemes need to minimize the scan-in switching rate during a shift operation in order to reduce power dissipation in the test mode. High power dissipation during test may result in either overheating or supply voltage noise—either of which can cause a device malfunction leading to loss of yield, reliability degradation, or even permanent damage of the CUT. A peak in scan-in switching is estimated by the toggling rate in the decompressed test stimuli during the last shift cycle. A more accurate estimate of the scan-in switching is based on a weighted transition metric (WTM) which takes into account the number of invoked transitions in decompressed test bits which are loaded in successive scan cells and their relative positions. In FIGS. 2(d) and 2(e), a shadow register is added between either a tester or decompressor scheme and scan chains to reduce toggling in the decompressed test stimuli. Particularly, the shadow register receives a control sequence that allows loading the same decompressed test bits in consecutive shift cycles. Also, a shadow register may have multiple segments such that each segment may selectively receive decompressed test bits from the decompressor schemes.

In summary, an advantage of the complex decompressors is high encoding efficiency and a more diverse output space with fewer decompressor-imposed constraints. An advantage of the simple decompressors is dynamic encoding wherein the encoding process is incorporated into the ATPG implication process to exploit this degree of freedom. As a result, the probability of encoding a particular test cube with a complex decompressor is higher because it has a more diverse output space than simple decompressor schemes. However, the fact that most faults can be detected by many different test cubes provides an additional degree of freedom during ATPG for aggressive test data compression and efficient dynamic test pattern compaction. In addition, desirable properties include a simple and flexible interface for routing test data from the tester to multiple units of decompressor circuitry as well as a simple and flexible mechanism to reduce the toggling rate in the decompressed test stimuli.

SUMMARY

Embodiments for constructing power-aware linear decompressors are described. The resultant decompressor scheme has 1) a diverse output space with fewer decompressor-imposed constraints than the simple decompressor schemes; 2) supports efficient dynamic encoding for early identification and resolving of encoding conflicts during ATPG; as well as 3) provides an efficient mechanism for reducing toggling rate in the decompressed test stimuli. As a result, the present invention provides an efficient mechanism for dynamic test pattern compaction and aggressive test data compression while improving WTM.

One aspect of the technology is an apparatus, comprising an integrated circuit (IC) including decompressor circuitry receiving a plurality of static variables originating from a tester and a plurality of dynamic variables originating from the tester, the decompressor circuitry decompressing the plurality of static variables and the plurality of dynamic variables into a decompressed test stimulus, and loading the decompressed test stimulus into scan chains of a circuit under test (CUT) in a plurality of shift cycles to detect defects in the CUT, wherein a static scope of the plurality of static variables lasts more shift cycles of the plurality of shift cycles than a dynamic scope of the plurality of dynamic variables.

The decompressor circuitry comprises: a first segment and a second segment each comprising memory elements (MEs) and (i) said first segment receives the plurality of static variables originating from the tester, and (ii) and said second segment, receives the plurality of dynamic variables originating from the tester; and a logic network coupled between (i) the scan chains of the CUT and (ii) said first segment and said second segment, the logic network generating to the scan chains of the CUT combinations of the plurality of static variables from the first segment and the plurality of dynamic variables from the second segment wherein the plurality of dynamic variables in the second segment divides scan cells in the scan chains of the CUT into groups such that (i) changing a value of a particular one of said plurality of dynamic variables in the second segment changes a subset of bits in the decompressed test stimulus, the subset of bits being loaded into a particular one of the groups of scan cells of the CUT; and (ii) none of the scan cells is shared by multiple ones of the groups.

In one embodiment, said logic network of the decompressor circuitry comprises a set of XOR gates such that each of the scan chains of the CUT is coupled to an XOR gate of the set of XOR gates and said XOR gate receives input from at least one ME of said first segment and at least one ME of said second segment of the decompressor circuitry.

In one embodiment, said first segment of the decompressor circuitry is configured to periodically receive said static variables from the tester and said second segment of the decompressor circuitry is configured to selectively receive said dynamic variables from the tester.

In one embodiment, said first segment of the decompressor circuitry receives said static variables from the tester via a serial shift register coupled to the tester via one or more streaming tester channels.

In one embodiment, a pair of the MEs of said second segment of the decompressor circuitry receives a same one of said dynamic variables from the tester.

In one embodiment, said second segment of the decompressor circuitry is configured to hold the dynamic variables from the tester for two or more shift cycles such that the MEs of said second segment contain same of the dynamic variables from the tester for two or more shift cycles.

In one embodiment, (i) the first segment, during at least the static scope, receives the plurality of static variables originating from the tester preferentially over the dynamic variables originating from the tester, and (ii) said second segment, during at least the dynamic scope, receives the plurality of dynamic variables originating from the tester preferentially over the static variables originating from the tester.

In one embodiment, said dynamic variables are associated with one or more partitions such that (i) each of the dynamic variables is uniquely associated with a group of scan cells in one of said partitions; and (ii) one of the partitions is associated with the second segment of the decompressor circuitry such that the (ii.a) the dynamic variables of said one of the partitions is loaded into the MEs of said second segment of the decompressor circuitry; and (ii.b) the MEs respectively contain one of the dynamic variables.

In one embodiment, said second segment of the decompressor circuitry is a circular shift register such that each ME receives one of the dynamic variables from a preceding ME and supplies one of the dynamic variables received to a following ME.

In one embodiment, the apparatus of claim 1, wherein the plurality of dynamic variables loaded into said second segment of the decompressor circuitry divides the scan cells of the CUT into groups such that each of the scan cells of the CUT belong to one of the groups.

Another aspect of the technology is a method, comprising:
encoding care bits into a test pattern comprising a plurality of static variables and a plurality of dynamic variables,
wherein the care bits are: (i) included in a decompressed test stimulus which is loaded into scan cells of a circuit under test (CUT) in a plurality of shift cycles and (ii) divided into static care bits and dynamic care bits, such that (i) the dynamic care bits are uniquely associated with the plurality of dynamic variables; (ii) encoding of the static care bits is based on the plurality of static variables; and (iii) encoding of the dynamic care bits is preferentially based on the plurality of dynamic variables over the plurality of static variables, In one embodiment, a static scope of the plurality of static variables is longer than a dynamic scope of the plurality of dynamic variables, the static scope lasting more shift cycles of the plurality of shift cycles than the dynamic scope, and wherein the care bits are a subset of bits of the decompressed test stimulus which are assigned to particular values and are loaded into particular ones of the scan cells to detect defects in the CUT.

In one embodiment, each of the dynamic care bits uniquely maps to one of the dynamic variables. As used herein, a dynamic variable is sometimes referred to as a "pivot element".

In one embodiment, said care bits loaded into the scan cells of the CUT target a fault detection of a fault in the CUT, the static care bits are encoded during test generation of said fault in the CUT and the dynamic care bits are encoded after test generation for said fault in the CUT is completed.

In one embodiment, the care bits are associated with corresponding characteristic equations including a unique combination of said plurality of static variables and said plurality of dynamic variables and wherein said method for encoding is based on a system of linear equations comprising one augmented characteristic equation for each of the static care bits wherein said augmented characteristic equation is calculated by superposition of the corresponding characteristic equations of said each of the static care bits and one or more of the dynamic care bits.

In one embodiment, each of said augmented characteristic equations includes only one or more of the static variables.

In one embodiment, the care bits of the decompressed test stimulus are divided into classes such that (i) each class of the care bits contains at most one dynamic care bit; and (ii) each of the dynamic care bits is uniquely associated with one of the dynamic variables.

In one embodiment, said classes of the care bits are associated with one or more partitions of the dynamic variables such that (i) each of the dynamic variables is associated with one of said partitions; (ii) the classes are associated respectively with at most one of the dynamic variables of each of the partitions; and (iii) the dynamic variables of respective ones of the partitions is loaded into a segment of memory elements (MEs) of a decompressor circuitry such that said MEs respectively contain one of the dynamic variables.

In one embodiment, said dynamic variables from the tester are loaded in MEs of a decompressor circuitry such that each of said MEs of the decompressor circuitry always contains one of the dynamic variables.

One embodiment, further comprises control variables of said test pattern wherein each of said control variables is uniquely mapped to: (i) a group of scan cells of the CUT, (ii) one of the dynamic variables and (iii) a set of test patterns such that each of said control variables disables said one of the dynamic variables for said group of scan cells of the CUT and said set of test patterns.

In one embodiment, said encoding of the care bits is incorporated into an ATPG implication process.

Yet another aspect of the technology is a computer readable medium including:

an EDA tool defining an integrated circuit (IC) including decompressor circuitry receiving a plurality of static variables originating from a tester and a plurality of dynamic variables originating from the tester, the decompressor circuitry decompressing the plurality of static variables and the plurality of dynamic variables into a decompressed test stimulus, and loading the decompressed test stimulus into scan chains of a circuit under test (CUT) in a plurality of shift cycles to detect defects in the CUT, wherein a static scope of the plurality of static variables lasts more shift cycles of the plurality of shift cycles than a dynamic scope of the plurality of dynamic variables, the decompressor circuitry comprising:

a first segment and a second segment each comprising memory elements (MEs) and (i) said first segment receives the plurality of static variables originating from the tester, and (ii) and said second segment, receives the plurality of dynamic variables originating from the tester; and a logic network coupled between (i) the scan chains of the CUT and (ii) said first segment and said second segment, the logic network generating to the scan chains of the CUT combinations of the plurality of static variables from the first segment and the plurality of dynamic variables from the second segment wherein the plurality of dynamic variables in the second segment divides scan cells in the scan chains of the CUT into groups such that (i) changing a value of a particular one of said plurality of dynamic variables in the second segment changes a subset of bits in the decompressed test stimulus, the subset of bits being loaded into a particular one of the groups of scan cells of the CUT; and (ii) none of the scan cells is shared by multiple ones of the groups.

BRIEF DESCRIPTION OF THE DRAWINGS

FIG. 14 shows steps of an encoding process.

FIG. 15 shows an interface between the APD and the tester.

FIG. 16 shows another example for interface between the APD and the tester.

FIGS. 17(a)-(f) show different schemes for splitting/sharing streaming test data between two APD units.

DETAILED DESCRIPTION

The following examples are specific non-limiting examples illustrating various advantageous features of the presented technology. Only a subset of features demonstrated in a single example may be in an embodiment of the presented technology. An embodiment of the presented technology may include features from multiple examples. The number and length of scan chains, the number and length of segments, number and type of seeds and variables, existence of toggling, toggling rate, and configurations are changeable with different embodiments.

EXAMPLE 1

Figure 1:
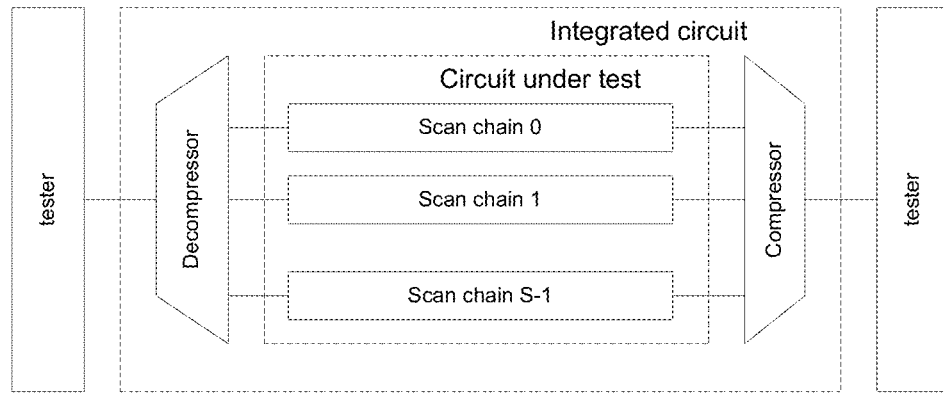
FIG. 1 is a block diagram of an integrated circuit with a circuit under test, including scan chains between decompressor and compressor, coupled to external tester.
Figure 2A:
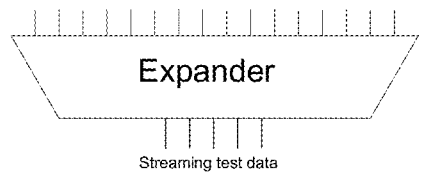
FIGS. 2(a)-(e) show different decompressor schemes.
Figure 2B:
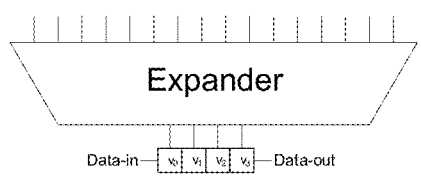
Figure 2C:
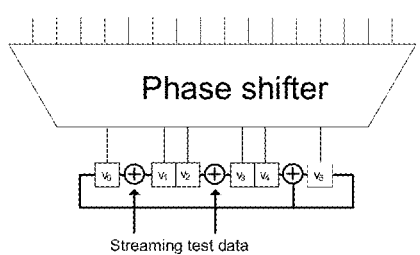
Figure 2D:
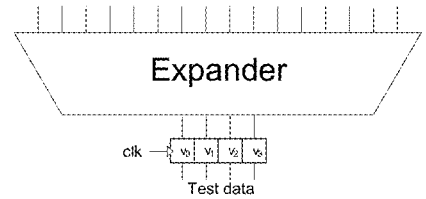
Figure 2E:
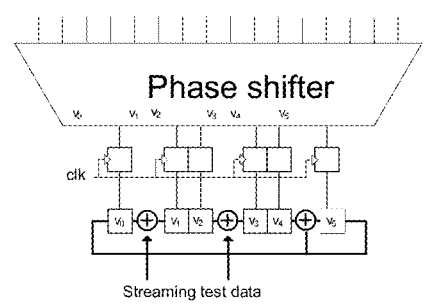
Figure 3A:
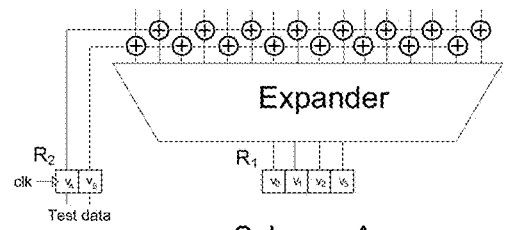
FIGS. 3(a)-(c) show further decompressor schemes.
Figure 3B:
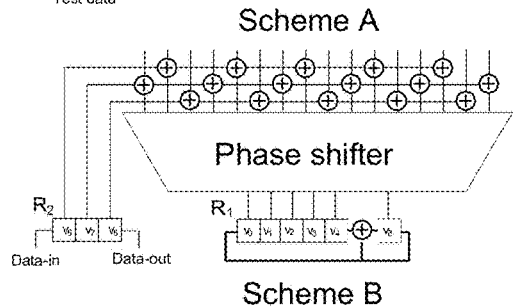
Figure 3C:
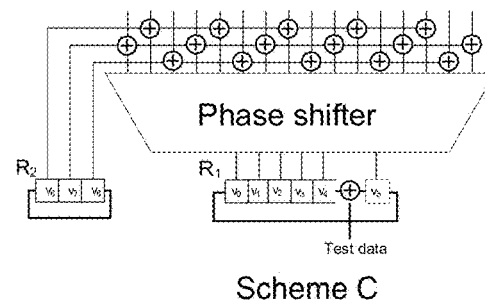

FIG. 3 illustrates embodiments of the present invention. More formally, scheme A is a block diagram of a power-aware decompressor comprising two registers $R_1$ and $R_2$ of length n and m, respectively. Register $R_1$ periodically receives static variables (or static seeds) from the tester. Register $R_2$ selectively receives dynamic variables (or dynamic seeds) from the tester. As a result, the dynamic variables have a limited scope (typically a few consecutive shift cycles) while static variables are typically valid for one test pattern or n shift cycles. Also, the scope of the dynamic variables (dynamic seeds) may change in wide range for each pattern while the scope of the static variables (static seeds) is typically fixed for the whole pattern set. Next, registers $R_1$ and $R_2$ are coupled to the scan chains of a CUT by a logic network (or XOR expander) such that register $R_2$ defines a partition. As a result, dynamic variables divide scan cells in the CUT into groups such that each group of scan cells is uniquely associated with one dynamic variable. In this way, changing a value of dynamic variable changes the decompressed test bits which are loaded into the corresponding group of scan cells. A distinctive feature of the described power-aware decompressor is that care bits specified during ATPG can be classified into static and dynamic care bits based on the described grouping such that each of the dynamic care bits is the first care bit in the corresponding group of scan cells. It is easy to check that dynamic care bits are directly encodable even when all static variables are assigned to 0 or 1. Accordingly, the static care bits are encoded by adding one augmented n-bit characteristic equation in a system of linear equations AV=C where A is a n×s characteristic matrix of the linear decompressor, n is the number of static variables and s is the number of static care bits. An encoding conflict exists when the system of linear equations has no solution. The dynamic care bits can be encoded after the ATPG process is completed. Note if both the decompressor scheme and encoding process satisfy certain conditions then an encoding conflict is impossible in this step. For a test pattern, the encoding typically derives one n-bit static seed and up to t m-bit dynamic seeds comprising up to n+mt variables from the tester where t is the number of shift cycles. Clearly, the computational complexity of the described 2-phase encoding algorithm is greatly reduced with respect to the conventional linear encoding which is described in the previous section because the size of the characteristic matrix A is reduced from (n+mt)×(s+d) to n×s where d is the number of dynamic care bits, s is the number of static care bits, n is the number of static variables, mt is the number of dynamic variables and d>>s. In this way, the present technology combines the advantages of both the simple and complex decompressor schemes discussed in the previous section. More formally, the described power-aware decompressor supports dynamic encoding and has a diverse output space with fewer decompressor-imposed constraints than the simple decompressor schemes. For example, an embodiment shown in FIG. 4 requires 10 variables for encoding 10 highlighted care bits; therefore an encoding ratio is 1. First, 4-bit static seed 1111 is loaded in register $R_1$ in shift cycle 0 followed by three 2-bit dynamic seeds loaded into register $R_2$ in shift cycles 2, 4 and 5, respectively. Note that the encoding ratio reflects only the amount of useful test data bits from the tester while the encoding efficiency reflects all deployed (both control and test data) bits from the tester. Since both registers are static (do not shift test data) then toggling in the decompressed test stimulus may exist after reseeding any register. The decompressed test stimulus includes 8 out of 24 possible transitions corresponding to a toggling rate of 0.33. Note that the described embodiment combines the objectives for optimizing both toggling rate and encoding ratio. More formally, for a given test cube both encoding ratio and toggling rate are optimized by minimizing the number of dynamic seeds. Scheme B and scheme C show other possible embodiments of the present technology which are applicable when a toggling reduction in the decompressed test stimuli is not required. Accordingly, shift registers $R_1$ and $R_2$ independently receive compressed test data from the tester and shift register $R_2$ comprises one or more segments such that each segment defines a partition over scan cells in the CUT. As a result, dynamic variables divide the scan cells in the CUT into groups such that (i) each group of scan cells is uniquely associated with a dynamic variable of register $R_2$; and (ii) each scan cell is uniquely associated with one dynamic variable of each segment of register $R_2$. Also, changing a value of a dynamic variable changes the decompressed test bits which are loaded into the corresponding group of scan cells. Similarly, scheme B and scheme C allow specified care bits during ATPG to be classified into dynamic (directly encodable) and static (non-directly encodable) care bits based on the described grouping. Also, the dynamic variables typically have a scope of m consecutive shift cycles and static variables typically have a scope of n shift cycles or one test pattern where n>m. Various features of some embodiments of the present technology are: 1) at least two registers $R_1$ and $R_2$ comprising one or more segments that can independently receive compressed test data (or static and dynamic variables, respectively) from the tester; 2) each register has at least one segment comprising two or more memory elements; 3) each scan chain receives an input from at least one memory element of register $R_1$; 4) each scan chain receives an input from at least one memory element of each segment of register $R_2$; 5) each of the memory elements of register $R_2$ always contains one dynamic variable from the tester; 6) dynamic variables which are loaded into register $R_2$ divide scan cells in the CUT into groups such that (i) each group of scan cells is uniquely associated with one dynamic variable of register $R_2$; (ii) each dynamic variable is associated with one segment of register $R_2$; (iii) groups of scan cells associated with dynamic variables of each segment do not share common scan cells; and (iv) groups of scan cells associated with dynamic variables of different segments of register $R_2$ share at least one common scan cell. In general, register $R_1$ can be any sequential decompressor using static or dynamic reseeding. Note that the described embodiments have a diverse output space with fewer decompressor-imposed constraints than the simple decompressor schemes and much lower computational complexity of the encoding process than the complex decompressor schemes. Hereafter, the discussion is focused on scheme A even though most of the discussed advantageous features are valid or applicable to scheme B and scheme C.

EXAMPLE 2

Figure 5:
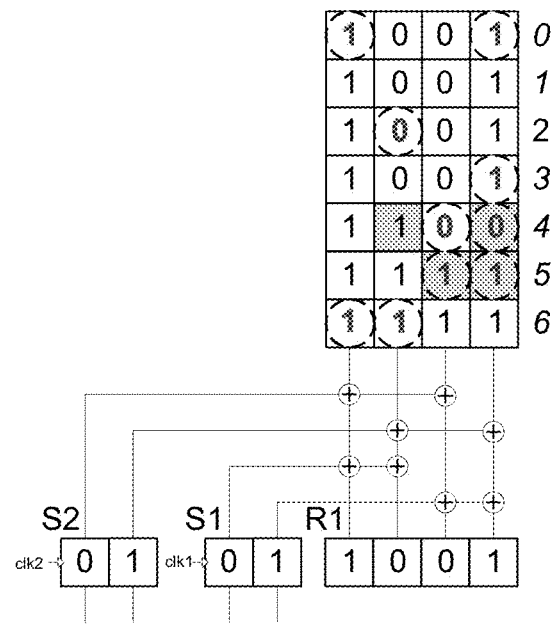
FIG. 5 shows a power-aware decompressor with independent selectively reloadable segments.

FIG. 5 shows another embodiment of the power-aware decompressor comprising a periodically reloadable register $R_1$ and a selectively reloadable register $R_2$ having two segments $S_1$ and $S_2$. In this embodiment, each of the segments comprises two or more memory elements such that each of the segments can independently receive dynamic seeds from the tester. In this case, two dynamic seeds are required to encode the highlighted care bits. More precisely, in shift cycle 0, 4-bit static seed 1001 is loaded in register $R_1$ and both segments $S_1$ and $S_2$ are initialized to 00. In shift cycle 4, dynamic seed 01 is loaded in segment $S_1$. In shift cycle 5, dynamic seed 01 is loaded in segment $S_2$. The encoding ratio for this case is 1.25 since the number of the specified care bits is 10 and the number of required variables from the tester is 8. Also, the toggling rate is 0.167 since the decompressed test stimulus includes 4 out of 24 possible transitions.

EXAMPLE 3

Figure 6:
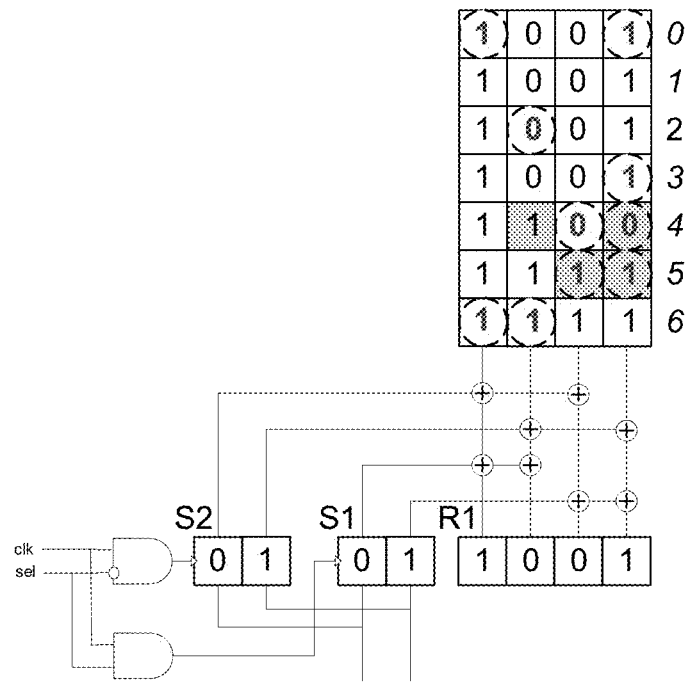
FIG. 6 shows a power-aware decompressor with dependent reloadable segments.

FIG. 6 shows another embodiment of the power-aware decompressor comprising a periodically reloadable register $R_1$ and two selectively reloadable segments $S_1$ and $S_2$ of register $R_2$. In this embodiment, only one of these selectively reloadable segments can receive a dynamic seed from the tester per shift cycle, such that segment $S_2$ can receive a dynamic seed in the current shift cycle from the tester if and only if segment $S_1$ received the previous dynamic seed, and vice versa. The encoding ratio and toggling rate for this embodiment are 1.25 and 0.167, respectively.

EXAMPLE 4

Figure 4:
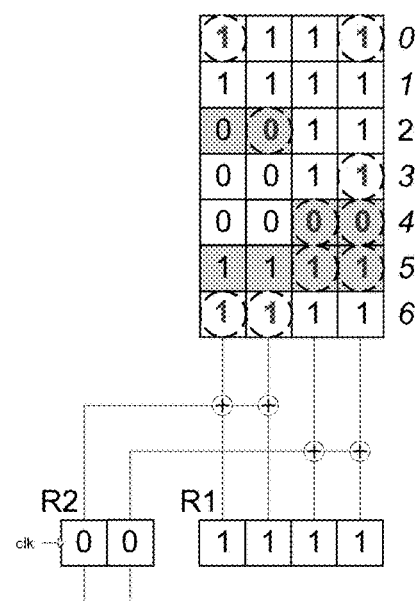
FIG. 4 shows a power-aware decompressor with one selectively reloadable register.
Figure 7:
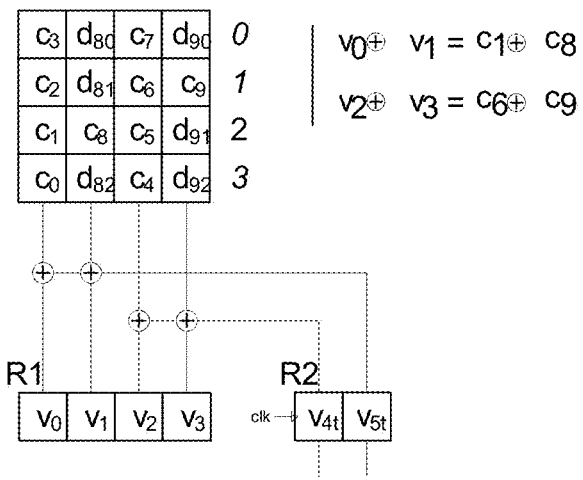
FIG. 7 shows encoding for power-aware decompressor with one selectively reloadable segment.

FIG. 7 illustrates the encoding process for the power-aware decompressor shown in FIG. 4. Accordingly, an example consists of 4 scan chains of length 4, register $R_1$ and register $R_2$ of length 4 and length 2, respectively. Four static variables $v_0$, $v_1$, $v_2$ and $v_3$ (or static seeds) are loaded in memory elements of register $R_1$ such that each memory element receives one variable from the tester. This particular example has one static seed, because the example focuses on encoding care bits in one test pattern. Also, two dynamic variables $v_{4t}$ and $v_{5t}$ or dynamic seeds are loaded in memory elements of register $R_2$ per shift cycle where t=(0, 1, 2, 3). A characteristic equation of each scan cell is derived as an XOR function of the corresponding variables. Let an ordered set of care bits $c_0$, $c_1$, $c_2$, ..., $c_9$ be specified during ATPG. A distinctive feature of the described decompressor scheme is that each specified care bit can be classified into static and dynamic care bits based on the described grouping such that the dynamic care bits are directly encodable and the static care bits are non-directly encodable. More formally, dynamic variables $v_{40}$, $v_{50}$, $v_{41}$, ..., $v_{53}$ divide scan cells into eight groups such that changing a value of a dynamic variable changes the decompressed test bits which are loaded into the corresponding group of scan cells. As a result, the first care bit in each group of scan cells is directly encodable even when all static variables are fixed to a particular value by changing the value of the corresponding dynamic variable. In this example, the first eight care bits $c_0$, $c_1$, $c_2$, ..., $c_7$ are directly encodable and the corresponding dynamic variables are $v_{53}$, $v_{52}$, $v_{51}$, ..., $v_{40}$, respectively. Accordingly, the encoding process can be decomposed into two phases—initial and final encoding—associated with static and dynamic variables as well as static (non-directly encodable) and dynamic (directly encodable) care bits, respectively. Next, care bits $c_8$ and $c_9$ are static and the corresponding dynamic care bits $c_1$ and $c_6$, respectively. Care bits c8 and c9 are static because these two care bits are second (not first) in a particular group of scan cells. The encoding process for static care bit is part of an initial encoding. These care bits are encoded by adding one augmented characteristic equation in the system of linear equations. This equation is computed as a superposition of characteristic equations of the static care bit and corresponding dynamic care bit (the first one for this particular group of scan cells). The right-hand side of FIG. 7 shows a system of linear equations for encoding static care bits $c_8$ and $c_9$. The system of linear equations consists of one augmented characteristic equation for each static care bit which is calculated by superposition of characteristic equations of each static care bit and the corresponding dynamic care bit. More formally, the first augmented characteristic equation is calculated as a superposition of characteristic equations of $c_8$ and $c_1$. The second augmented characteristic equation is calculated as a superposition of characteristic equations of $c_9$ and $c_6$. All care bits are encodable if and only if the corresponding system of linear equations has a solution. Note that the augmented characteristic equations include only static variables since characteristic equations of each static care bit and the corresponding dynamic care bit depend on a same unique set of dynamic variables. The size of the system of linear equations is 4×2. In contrast, the conventional encoding requires the system of linear equations to include one column for each variable and one row for each care bit. Therefore, the size of the system of linear equations is 10×c where c is the number of care bits. In addition, some more decompressor-imposed constraints can be identified using quadruplets wherein a quadruplet is set of four linearly dependent scan cells. Clearly, four scan cells in the intersections of a pair of scan chains and a pair of shift cycles form a quadruplet. To avoid encoding conflict, scan cells in each quadruplet should have an even number of 1's. Based on this rule, a value of scan cell $d_{81}$ is implied by care bit $c_8$ based on the following equation: $d_{81}=c_1 \oplus c_2 \oplus c_8$. Similarly, a value of scan cell $d_{92}$ is implied by care bit $c_9$ based on the following equation: $d_{92}=c_4 \oplus c_6 \oplus c_9$. In this particular embodiment, the initial encoding is able to identify all necessary implications; therefore all generated care bits are encodable. Initial encoding ends with derived values for all static variables followed by final encoding for directly encodable care bits based on dynamic variables. In this particular case, the final encoding is straightforward since each directly encodable care bit uniquely depends on one dynamic variable. Also, the test cube is always encodable even when the value of dynamic variables $v_{4t}$ and $v_{5t}$ are fixed to value 0 for an arbitrary shift cycle t. As a result, the maximum number of variables from the tester is 10 comprising a 4-bit static seed and up to three 2-bit dynamic seeds. Therefore, the encoding ratio is 1 and 10 care bits are encoded without conflict using 10 variables from the tester. Note that both the encoding ratio and toggling rate can be optimized based on the actual values of the specified care bits. For example, if $c_0=c_1=c_2=c_3$ and $c_4=c_5=c_6=c_7$ then the number of required dynamic seeds is 0 and toggling rate in the decompressed test stimulus is 0.

EXAMPLE 5

Figure 8:
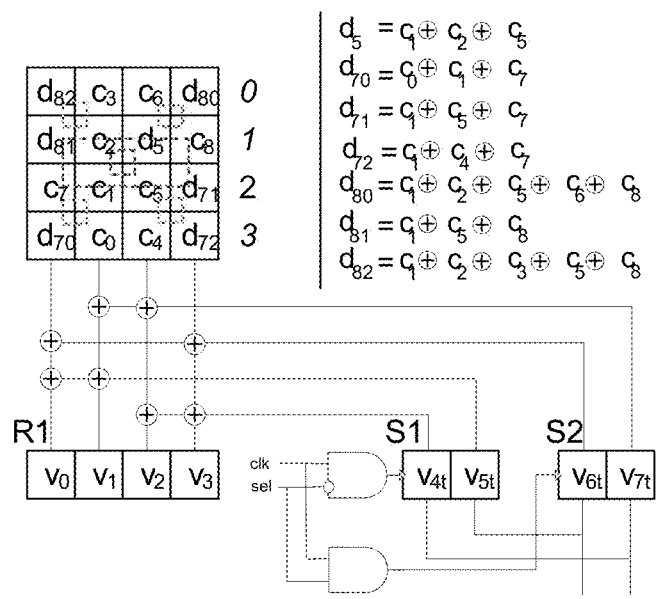
FIG. 8 shows encoding for power-aware decompressor with two dependentH selectively reloadable segments.

FIG. 8 illustrates the encoding process for the power-aware decompressor shown in FIG. 6. An embodiment comprises 4 scan chains with a length of 4 scan cells, register $R_1$ of length 4 and register $R_2$ with two dependent segments $S_1$ and $S_2$ of length 2. Let register $R_1$ receive a 4-bit static seed $(v_0, v_1, v_2, v_3)$ from the tester and segments $S_1$ and $S_2$ are initialized to 0 in shift cycle 0. Next, segment $S_1$ receives a 2-bit dynamic seed $(v_{42}, v_{52})$ from the tester in shift cycle 2 and segment $S_2$ receives dynamic seeds $(v_{61}, v_{71})$ and $(v_{63}, v_{73})$ from the tester in shift cycles 1 and 3. Dynamic variables divide scan cells in shift cycles 1, 2 and 3 into four classes which are formed by intersecting groups of a pair of partitions. Clearly, four classes of each of these shift cycles are linearly dependent and form a quadruplet. As a result, the last class of each shift cycle depends on the previous three classes of scan cells. FIG. 8 shows six quadruplets between classes of scan cells in different shift cycles which are introduced by holding dynamic seeds $(v_{61}, v_{71})$ and $(v_{42}, v_{52})$ for more than one consecutive shift cycle. Let an ordered set of care bits $c_0, c_1, c_2, \ldots, c_8$ be specified during ATPG. All these care bits are directly-encodable since each one of the care bits belongs to independent classes (or the first three classes of a quadruplet). The right-hand side of FIG. 8 shows equations for all dependent classes, $d_5$, $d_{70}$, $d_{71}$, $d_{72}$, $d_{80}$, $d_{81}$ and $d_{82}$. The encoding ratio is 0.9 and 9 care bits are encoded by 10 variables from the tester. Note that both the encoding ratio and toggling rate can be optimized based on actual values of the care bits. For example, if all care bits in each chain incidentally have the same value then the number of required dynamic seeds is 0 and toggling rate in the decompressed test stimulus is 0.

EXAMPLE 6

Figure 9:
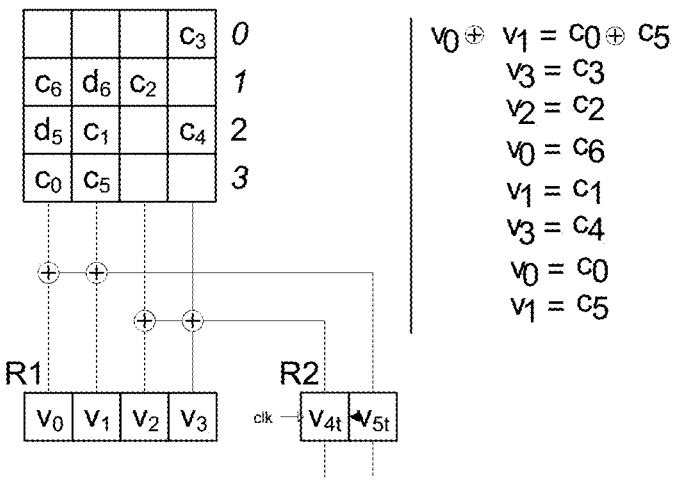
FIG. 9 shows encoding to minimize WTM.

FIG. 9 shows an example of toggling reduction for the power-aware decompressor shown in FIG. 4. Let the number of specified care bits during ATPG be much smaller than the number of variables from the tester. In this case, the degree of freedom of the initial encoding process can be used to reduce the toggling rate in the decompressed test stimuli. Let care bits be $c_0, c_1, c_2, \ldots, c_6$ also let $d_5$ and $d_6$ be two implications (necessary assignments) based on care bits $c_5$ and $c_6$, respectively. In this case, only the care bit $c_5$ is static because $c_0$ and $c_5$ belong to the same class of scan cells. As a result, the system of linear equations includes one augmented characteristic equation for care bit $c_5$. Clearly, loaded values in shift cycles 0 and 1 have the highest impact on the WTM since transitions in loaded values will result in switching activity for all consecutive shift cycles. To avoid any transition in shift cycles 0 and 1, all dynamic care bits associated with these two shift cycles need to be encoded based on static variables by adding characteristic equations for care bits $c_2$, $c_3$ and $c_6$ to the system of linear equations. If the resultant system of linear equations has a solution then dynamic seed 00 is required in register $R_2$ for the first two shift cycles. To improve the WTM, the initial encoding needs to include as many dynamic care bits as possible in the system of linear equations starting with dynamic care bits in shift cycle 0, 1, . . . , 3. The right-hand side shows a system of linear equations generated based on this approach. For $c_1=c_5$, $c_0=c_6$ and $c_3=c_4$, the presented system of linear equations has a solution and both the toggling rate in the decompressed test stimulus and the number of dynamic seeds are equal to 0. This example shows that the present embodiment effectively combines the objectives for optimizing both the WTM and the encoding ratio.

EXAMPLE 7

An XOR expander is a combinational network which expands n streaming test data bits from the tester to m decompressed test bits per shift cycle such that a number of successfully encoded care bits per shift cycle is maximized where m>>n. To achieve this any combination of h care bits should be linearly independent where h≥2. Synthesis of XOR expanders is typically based on coding theory and the expander is represented as a binary matrix m×n such that each row corresponds to an expander input (or an output of the tester) and each column corresponds to an expander output (or a scan chain in the CUT). The entry in row i and column j of the binary matrix is 1 if and only if the j-th scan chain depends on the i-th input; the matrix entry is 0 otherwise. A set of scan chains is linearly dependent if the superposition of the corresponding columns is equal to all 0s. Recently, the augmented product codes have been successfully used for constructing space and time compactors and sequential decompressors, for example, in U.S. Pat. No. 7,949,269 and US patent application 20120239995, respectively, both incorporated by reference herein. In this example, this work is expanded for constructing augmented power-aware decompressors. A 3-dimensional APC (augmented product code), $APC(n^3, 6n)$, views $n^3$ information bits (x,y,z) as a 3-dimensional array n×n×n and six sets of parity check bits are calculated based on the following formulas: x, y, z, (x+y) mod n, (x+z) mod n, (y+z) mod n. For odd n≥3, the $APC(n^3, 6n)$ has Hamming distance 6 and each double-bit error produces a unique error syndrome. Similarly, an expander constructed based on the $APC(n^3, 6n)$ guarantees that any four scan chains are linearly independent.

Procedure 1: Let $n^3$ scan chains be viewed as an n×n×n bit array and a unique triplet (x,y,z) be assigned to a chain in row x, column y and block z. Augmented power-aware decompressor, APD(n,s,m,d), consists of register $R_1$ including s segments of length n, register $R_2$ including d segments of length m where n≥m, s≤6, d≤2 and an XOR expander which is constructed by s+1 mutually orthogonal partitions such that:

(i) each formula {x, y, (x+y) mod n, (x+z) mod n, z and (y+z) mod n} divides scan chains into n groups and scan chain (x,y,z) is connected to the i-th bit of segment $S_k$ of register $R_1$ if and only if (x+y+z) mod (n+1)≠k for $\forall k=(0,1,\ldots,s-1)$ and $\forall i=(0,1,\ldots,n-1)$.

(ii) each formula {((x+y) mod n) mod m, ((x+z) mod n) mod m} divides scan chains into m groups and scan chain (x,y,z) is connected to the i-th bit of segment $S_k$ of register $R_2$ for $\forall k=(0,1,\ldots,d-1)$ and $\forall i=(0,1,\ldots,m-1)$.

Figure 10:
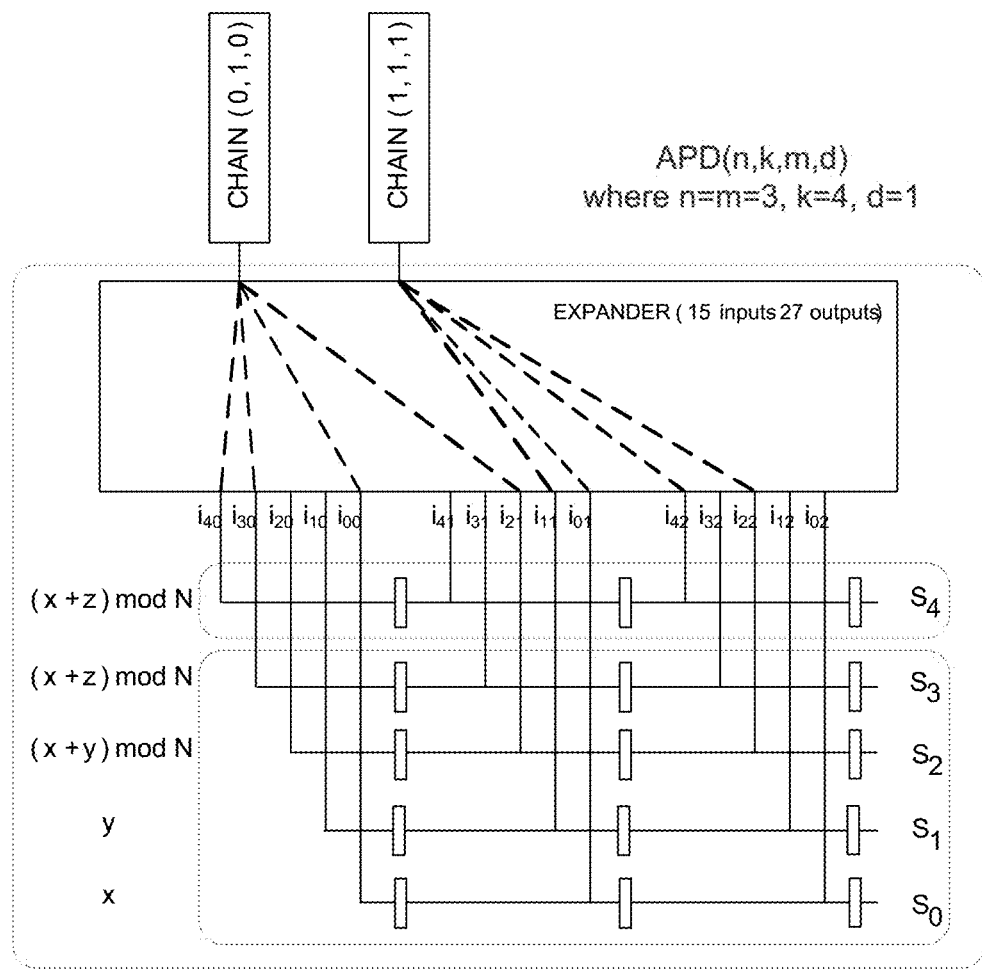
FIG. 10 shows construction of expander of APD(n,k,m,d) where n=m=3, k=4, d=1. (APD means "augmented power-aware decompressor").

FIG. 10 shows an example of APD(n,k,m,d) where n=3 and m=3 are the number of groups of scan chains in the corresponding partition, k=4 is the number of segments $S_0$, $S_1$, $S_2$, $S_3$ of register $R_1$ and d=1 is the number of segments $S_4$ of register $R_2$. Accordingly, the APD consists of two registers and an XOR expander constructed based on k+1 mutually orthogonal partitions specified by the following formulas {x, (x+y) mod n, y, (x+z) mod n, (x+y+z) mod (n+1)}. The synthesis procedure includes the following steps: 1) assign a unique triplet to each scan chain (x,y,z) where x,y,z={0,1,2, . . . ,n−1}; 2) assign an unique index {0,1,2, . . . ,n−1} to each memory element based on its position in the corresponding segment; 3) assign a unique formula to each segment $S_i$ of register $R_1$ for i=0,1, . . . ,3; 4) assign a formula to segment $S_4$ of register $R_2$; 5) connect each scan chain (x,y,z) to one memory element in each segment such that the value of the corresponding formula determines the index of the corresponding memory element; and 6) disconnect scan chain (x,y,z) from segment $S_i$ of register $R_1$ if (x+y+z) mod (n+1)=i where i=(0,1, . . . ,3). The resultant XOR expander has (k+d)n inputs and $n^3$ outputs such that the inputs are divided into k+d groups of n inputs $\{I_0, I_1, . . . ,I_{k+d-1}\}$ which are coupled to segments $\{S_0, S_1, . . . ,S_{k+d-1}\}$, respectively. More formally, an input $i_{pq}$ of the XOR expander is coupled to the q-th memory element of segment $S_p$ wherein p is the index of the segment and q is the index of the specific memory element in segment $S_p$. The resultant connections determined by Procedure 1are illustrated for scan chain (0,1,0) and scan chain (1,1,1). Note that, for k=4, any three scan cells are linearly independent. Also, for k=6, any four scan cells in one shift cycle are linearly independent. The resultant XOR expander has lower linear dependency between scan cells than the XOR expander constructed based on the APC($n^3$,6n). Also, segments $S_3$ and $S_4$ use the same formula that reduces the number required gates in the XOR expander. Also, partitions for constructing the XOR expander are preferably mutually orthogonal.

EXAMPLE 8

Decompressed test stimuli generated by the APD can be viewed as a superposition of "periodic" and "dynamic" test sequences. The periodic test sequence is determined by the static seeds which are periodically loaded into register $R_1$. The dynamic test sequence is determined by the dynamic seeds which are selectively loaded in segments of register $R_2$. To reflect this, the encoding process is decomposed into two phases, initial and final encoding, which are associated one with two non-overlapping sets of care bits: static (non-directly encodable) and dynamic (directly encodable), respectively. More formally, the goal of the initial encoding is to immediately identify and resolve the encoding conflicts during branch-and-bound ATPG search based on the static care bits and calculate the static seeds. The goal of the final encoding is to encode the dynamic care bits after ATPG for the current test pattern is completed, and calculate the dynamic seeds. Hereafter, principles of the proposed 2-phase encoding process are described based on the following conditions: 1) one static seed per test pattern; 2) two independent selectively reloadable segments of register $R_2$ that can be selectively reseeded per shift cycle. In other words, the static variables have a scope of one test pattern and the dynamic variables have a scope of one or more shift cycles.

Let a dynamic equation of a care bit be determined by substituting all static variables in the corresponding characteristic equation with their assigned values. Next, dynamic variables divide the care bits in a shift cycle into classes such that (i) all care bits of a class have equivalent dynamic equations (or depend on the same set of dynamic variables); (ii) each set of linearly dependent classes has at least one dependent class and all other classes are independent; and (iii) the first care bit of an independent class is dynamic (or directly encodable) and all other care bits are static (non-directly encodable).

Initial encoding: The initial encoding includes two steps: unconstrained and constrained. During the unconstrained encoding, care bits do not introduce any additional constraints with respect to the other scan cells. The unconstrained encoding continues until the first encoding conflict. For a perfect decompressor, the unconstrained encoding continues until every static variable is assigned a value of either 0 or 1. During the constrained encoding, all static variables are already assigned to either 0 or 1 and the first care bit in each class is treated as a dynamic care bit (or directly encodable) and it implies the loaded values of all scan cells in the corresponding class. In this way, the constrained encoding provides a mechanism for efficient pruning of the branch-and-bound search space during ATPG.

The unconstrained encoding is based on the following rules: 1) the first care bit of an independent class is directly encodable and it determines the characteristic equation of the corresponding class; 2) the characteristic equation of a dependent class is determined by a superposition of the characteristic equations of the corresponding independent classes; 3) each static care bit and relevant dynamic care bit(s) are represented in the system of linear equations by one augmented characteristic equation which is calculated by a superposition of the characteristic equations of this care bit and the corresponding relevant class(es). Note that each augmented characteristic equation depends on static variables only because the dynamic equations of the corresponding first care bit of a class and relevant class(es) are either identical or linearly dependent.

Final encoding: The final encoding process is based on the values assigned to all static variables during the initial encoding and includes the following steps: 1) determine a dynamic equation for each dynamic care bit; 2) for each shift cycle, from the first to the last one, encode all dynamic care bits with as few dynamic seeds as possible while minimizing the toggling between adjacent dynamic seeds.

Figure 11:
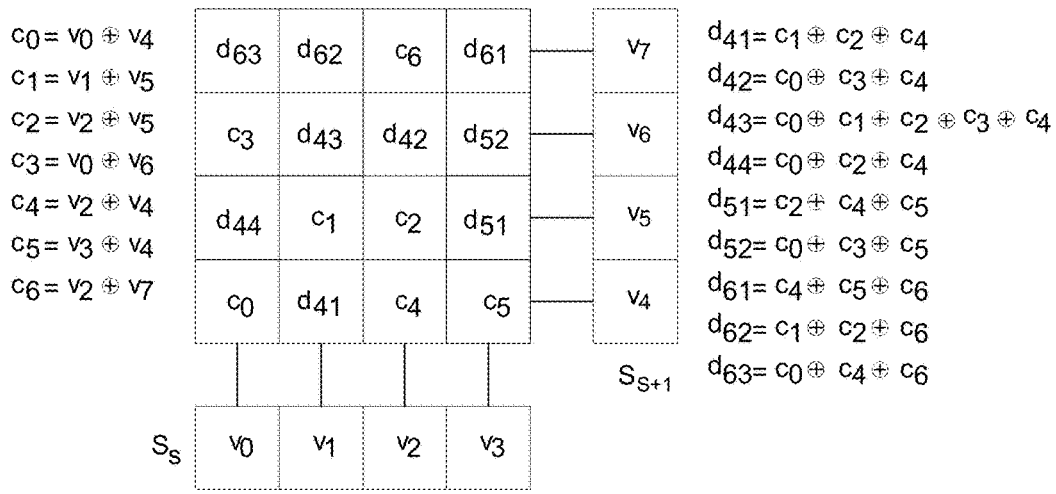
FIG. 11 shows an implication process for APD(n,k,4,2).
Figure 12:
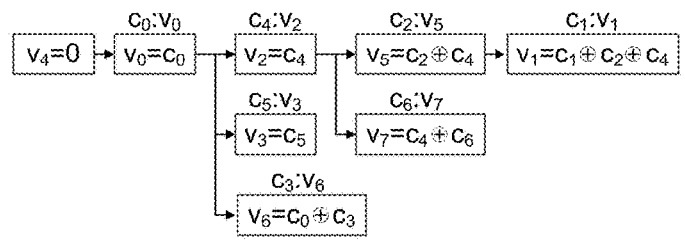
FIG. 12 shows assignment of unique dynamic variable to each independent care bit.

FIG. 11 illustrates an encoding process of the APD(n,k,m,d) for m=4 and d=2. In this case, scan cells in one shift cycle are divided into 16 classes based on two dynamic partitions. Clearly, all scan cells in a class have equivalent dynamic equations and depend on the same set of dynamic variables. As a result, the first care bit in each class implies the values of all scan cells in the dynamic test sequence. Let care bits $c_0, c_1, . . . , c_6$ belong to different classes within one shift cycle such that the index determines an order of these care bits that are specified during ATPG. The left-hand side of FIG. 11 shows the dynamic equations that are valid for all scan cells in the corresponding class. It is easy to check that dynamic equations of care bits $c_0, c_1, . . . , c_6$ are linearly independent and therefore the corresponding classes are independent. Next, four classes located at the intersection of a pair of rows with a pair of columns are linearly dependent and form a "quadruplet". Clearly, four classes in a quadruplet are linearly dependent because each one of the corresponding four dynamic variables appears twice in the dynamic equations of the four classes in the quadruplet. An encoding conflict exists if four classes of a quadruplet contain an odd number of 1's in the dynamic test sequence. To avoid this condition, the initial encoding computes the characteristic equation of the last class of each quadruplet as a superposition of the characteristic equations of the previous three independent classes. To illustrate this, the dependent classes introduced by care bit $c_a$ are labeled as $d_{ab}$ where a=(0, 1, . . . , 6) and b is a unique index for each dependent class. Let the characteristic equations of care bit $c_i$ be $f_i(v)$ for i=(0, 1, . . . , 9), care bit $c_7$ be the second care bit of independent class $c_0$ and care bits $c_8$ and $c_9$ be the first and second care bits of dependent class $d_{44}$, respectively. For the shift cycle under consideration, all care bits after $c_6$ are static care bits (non-directly encodable) and need to be included in the system of linear equations. Accordingly, the augmented characteristic equation of static care bit $c_7$ is: $f_0(v) \oplus f_7(v) = c_0 \oplus c_7$. The augmented characteristic equation of static care bit $c_8$ is: $f_0(v) \oplus f_2(v) \oplus f_4(v) \oplus f_8(v) = c_0 \oplus c_2 \oplus c_4 \oplus c_8$. Similarly, the augmented characteristic equation of static care bit $c_9$ is: $f_0(v) \oplus f_2(v) \oplus f_4(v) \oplus f_9(v) = c_0 \oplus c_2 \oplus c_4 \oplus c_9$. The unconstrained encoding continues until the first encoding conflict followed by constrained encoding until each of the remaining independent classes is associated with a dynamic care bit. Next, the final encoding is performed for encoding dynamic care bits and calculating dynamic seeds. Accordingly, the final encoding starts with deriving a dynamic equation for each dynamic care bit by substituting values assigned to all static variables during the initial encoding. As a result, either value 0 or 1 is assigned to classes associated with at least one dynamic care bit and value X (don't care) is assigned to the remaining classes of scan cells. Next, a unique dynamic variable is associated with each dynamic care bit by assigning either value 0 or 1 to an arbitrary dynamic variable (see FIG. 12). This unique dynamic variable can be used as a pivot element for encoding the corresponding dynamic care bit. Since every dynamic care bit has a pivot element then all dynamic care bits are always encodable. In addition, the final encoding needs to reduce the toggling between consecutive dynamic seeds using the available degrees of freedom. The described encoding process can be adapted to support multiple segments in both registers as well as support both sharing and splitting dynamic and static seeds across multiple units of the decompressor circuit. In the last case, the number and order of static seeds for each decompressor unit is determined before or during the initial encoding while the number and order of dynamic seeds for each decompressor unit is determined during the final encoding.

Figure 13:
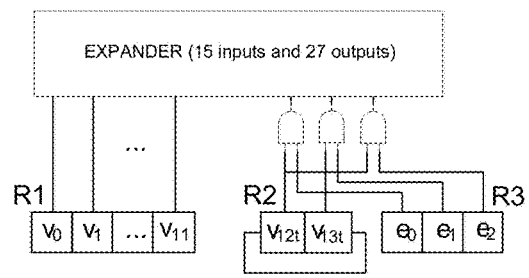
FIG. 13 shows low-power APD(3,4,2,1).

FIG. 13 shows an example of a low power APD(n,k,d,s) for n=3, k=4, d=2 and s=1. Accordingly, an expander network is constructed based on Procedure 1 which is discussed in Example 7. The expander network has k+s sets of n inputs uniquely associated with k+s partitions of n groups. Each memory element of kn-bit register $R_1$ is coupled to a input of the expander network associated with partitions 0, 1, . . . , k−1 while each memory element of sd-bit register $R_2$ is associated to an input of the expander network based on partitions k, k+1, . . . , k+s−1. In addition, the low power APD(n,k,d,s) has a sn-bit register $R_3$ such that each memory element of register $R_3$ enables/disables passing values of the memory elements of register $R_2$ to the corresponding input of the expander network. In this way, register $R_3$ disables the dynamic variables which are loaded into register $R_2$ for the groups of scan chains corresponding to the inputs of the expander network. This approach provides further improvement of the WTM when needed. Register $R_3$ may be treated as an independent register or an extension of register $R_1$. If both registers $R_1$ and $R_3$ are loaded per test pattern then a toggling rate in disabled groups of scan chains will be reduced to 0. A typical usage of Register $R_3$ is based on limiting the number of enabled groups for partitions k, k+1, . . . , k+s−1. Accordingly, if all groups associated with a scan chain are disabled then the first care bit of this scan chain determines the loaded values of all scan cells of this scan chain. Such a rule can be incorporated into the described dynamic encoding process. In a particular example, register $R_2$ is configured as a circular shift register which periodically receives dynamic variables (or dynamic seeds) from the tester. In this way, register $R_3$ reduces the impact of a shift operation on the WTM. Similarly, register $R_1$ can be configured as a circular shift register shifting test data per h shift cycles where h>1.

FIG. 14 summarizes steps of the encoding process. Accordingly, initial encoding includes unconstrained encoding of static care bits until the first encoding conflict followed by constrained encoding until each of the remaining independent classes is associated with a dynamic care bit. These steps are described in Examples 1-5. If all static care bits are encoded or some static variables are not assigned to either 0 or 1, the initial encoding may include a step for reducing the toggling rate in the decompressed test stimulus as described in Example 6. As a result, all static variables are assigned to either 0 or 1 and a value of each scan cell in the periodic test sequence can be calculated based on the derived static seed or seeds. Next, all dynamic care bits are adjusted based on the periodic test sequence (static seeds) followed by final encoding. Finally, the dynamic seeds are optimized to reduce the toggling rate in the decompressed test stimulus. As a result, the decompressed test stimulus loaded in every scan cell can be calculated by superposition of the periodic and dynamic test sequences.

EXAMPLE 9

FIG. 15 shows an example interface between the APD and the tester. The interface is based on one or more streaming tester channels wherein each channel is associated with either static seeds or dynamic seeds. Typically, static seeds are loaded into a serial shift register which transforms streaming test data bits into seeds. Assuming one streaming tester channel for reseeding register $R_1$, an n-bit static seed is loaded into the serial shift register for n shift cycles. If two streaming tester channels are used for loading static seeds into the serial shift register then reseeding time is $\lfloor n/2 \rfloor$ shift cycles. Next, the number of required streaming tester channels for reseeding register $R_2$ is typically equal to the length of its segments. However, the number of required streaming tester channels (or the size of dynamic seeds) can be selectively reduced if two or more bits in register $R_2$ receive test data from the same streaming tester channel. In the particular example, a mapping between the streaming tester channels and bits of register $R_2$ is determined by a single control bit. Both described approaches provide a mechanism to control the amount of deployed static and dynamic variables from the encoding process. These are advantageous features of the APD and provide flexibility to selectively adjust the amount of the deployed variables from the encoding process as needed based on the number specified care bits during ATPG. The encoding process may analyze the need for dynamic variables and change the number of dynamic variables during ATPG.

FIG. 16 shows another example interface between the APD and the tester wherein the same streaming tester channels are used for loading both static and dynamic seeds. Accordingly, tester cycles are divided into two non-overlapping sets $clk_1$ and $clk_2$ such that tester cycles in set $clk_1$ are used for loading static seeds into the serial shift register of register $R_1$ and tester cycles in set $clk_2$ are used for loading dynamic seeds into register $R_2$. More formally, the tester cycles in set $clk_1$ are used for an initialization of the decompressor scheme (or loading static seed) before executing the first shift cycle of a test pattern (no data are shifted-in in the CUT during this operation) and the tester cycles in set $clk_2$ are associated with shifting decompressed test stimulus into the CUT. The number of tester cycles in each set is fixed per test pattern so that clock signals clk$_1$ and clk$_2$ can be generated by embedded control block without any extra control bits from the tester.

EXAMPLE 10

FIG. 17 shows examples for routing streaming test data across multiple APD units. The first approach allows sharing and splitting streaming test data (static seeds, dynamic seeds or both) from the tester between two or more cores for a set of test patterns (control-per-test). The following three control-per-test schemes illustrate the first approach: A1) two or more APD units share streaming test data from the tester; B1) only one of the APD units receives streaming test data for all shift cycles of a test pattern based on the value of the control bit; and C1) One of the APD units receives streaming test data per shift cycle based on the value of the control bit which is coupled to data input of a T-type flip-flop. If the value of the control bit is 0 then one of the APD units receives streaming test data for all shift cycles. If the value of the control bit is 1 then different APD units receive dynamic seeds in any two consecutive shift cycles. The second approach splits the streaming test data from the tester based on a control sequence wherein the control sequence is configured to change per shift cycle (control-per-shift). The following three control-per-shift schemes illustrate the second approach: A2) the control sequence is provided by the tester; B2) the control sequence is embedded in the streaming test data from the tester; and C2) the control sequence is generated by a control block: a counter, LFSR, ring generator, circular shift register or shift register. More specifically, let the control block be a 6-bit circular shift register which is loaded from the tester per test pattern or with a set of test patterns. In this case, each shift cycle can be associated with a bit of the circular shift register such that the value of this associated bit (0 or 1) determines which APD unit receives streaming test data for this particular shift cycle. For control-per-shift, encoding process may include at least the following two cases: Scenario 1) the first APD unit takes as many dynamic seeds as needed until the first encoding conflict (unconstrained encoding) followed by unconstrained and constrained encoding of the second unit; Scenario 2) each APD unit can receive up to a predetermined number of unconstrained care bits (UCBs). For both scenarios, if one APD unit requires a dynamic seed for shift cycle t then other APD units should merge together the classes of scan cells for shift cycles t and t+1. Handling such dependency across multiple shift cycles is a straightforward operation for the described 2-phase encoding process. In summary, efficient routing of streaming test data from the tester may include splitting and sharing the same static seeds, dynamic seeds or both across multiple APD units. For example, sharing the same static seeds and dynamic seeds provides an efficient mechanism for TDVR and TATR when a CUT has two or more identical cores. Also, sharing and splitting seeds provides more efficient handling for an uneven distribution of the care bits across cores of the CUT as well as an uneven distribution of the care bits at the beginning and the end of a test pattern set. In particular, scheme A1 provides an efficient mechanism for TDVR and TATR in the following two cases: 1) the CUT has multiple identical cores that can be treated as a single instance; and 2) the CUT has two or more non-identical cores that can be treated as a composite core. For case 2, each of the two or more non-identical cores may have a local APD unit such that the local APD units receive the same streaming test data from the tester. As a result, the encoding process needs to treat these local APD units as a complex APD unit that allows more effective handling of an uneven distribution of care bits across non-identical cores as well as an uneven distribution of the care bits at the beginning and the end of a test pattern set.

Experimental Analysis

TABLE 1

Comparison with alternative decompressor schemes

| | #test data bits | | | APD(n, 4, 2, 2) | | |
|---|---|---|---|---|---|---|
| Circuit | Shared Scan | EDT | Viterbi | #chains | #patterns | #data bits |
| S9234 | N.A. | 9534 | 9149 | 106 × 2 | 164 | 3936 |
| S13207 | 6512 | 10585 | 8941 | 107 × 6 | 136 | 4352 |
| S15850 | 8960 | 9805 | 9532 | 107 × 5 | 225 | 6750 |
| S38417 | 21868 | 31458 | 29457 | 117 × 14 | 414 | 19872 |
| S38584 | 16536 | 18568 | 16529 | 119 × 12 | 227 | 9988 |
| Circuit A | 126760 | N.A. | N.A. | 1204 × 8 | 1684 | 101040 |
| Circuit B | 121056 | N.A. | N.A. | 1908 × 7 | 2054 | 135564 |
| Circuit C | 949590 | N.A. | N.A. | 4633 × 15 | 3031 | 297038 |

TABLE 1 compares the APD with alternative decompression schemes based on the ISCASS'89 benchmark and three industrial circuits. The purpose of this experiment is to evaluate an efficiency of dynamic encoding and dynamic test pattern compaction for TDVR and TATR. The selected alternative decompressor schemes include: 1) "A Reconfigurable Shared Scan-in Architecture" published in Proc. VLSI Test Symposium 2003 (a combinational decompressor based on multiple scan configurations, dynamic encoding and dynamic test pattern compaction), 2) "Embedded Deterministic Test" published in IEEE Transactions on Computer-Aided Design, vol. 23, no. 5, pp. 776-792, May 2004 (a sequential decompressor, static encoding and static test pattern compaction); and 3) "Viterbi-Based Efficient Test Data Compression" published in IEEE Transactions on VLSI Systems, vol. 31, No 4, pp. 610-619, 2012 (a sequential decompressor with limited sequential depth, static encoding and dynamic test pattern compaction); all incorporated by reference herein. For scan chain configuration s×h, the APD(n,4,2,2) receives 4n+2h variables per test pattern where s is the number of scan chains and h is the length of the longest scan chain. The APD for this experiment is based on two streaming tester channels as shown in FIG. 16. More formally, for each test pattern, a 4n-bit static seed is loaded into the serial shift register in tester cycles {0, 1, 2, . . . , 2n−1}. Next, the static seed is transferred into register R$_1$ and register R$_2$ is initialized to 0 in tester cycle 2n−1. Finally, compressed test data of the streaming tester channels are loaded in segments of register R$_2$ for tester cycles {2n, 2n+1, 2n+2, . . . , 2n+h−1} wherein segment S$_1$ and segment S$_2$ receive 2-bit dynamic seeds in odd and even shift cycles/tester cycles, respectively. Note that all streaming tester channels are effectively used in the encoding process without any need of control data from the tester. For 7 out of 8 circuits, the APD achieved higher TDVR than the alternative decompression schemes. The average TDVR with respect to the best previous result for each circuit is 65 percent.

TABLE 2

TDVR/TATR for the APD(18, 4, 18, 2) with circular registers

| Cores | #gates | #chains | #cells | #pats | TDVR/TATR for s streaming channels ||||| 
|---|---|---|---|---|---|---|---|---|---|
|  |  |  |  |  | s = 2 | s = 3 | s = 4 | s = 6 | s = 9 |
| D1 | 427K | 213 × 180 | 38277 | 1096 | 44.94 | 39.62 | 34.80 | 27.36 | 19.76 |
| D2 | 525K | 369 × 180 | 66294 | 4296 | 154.83 | 108.50 | 84.45 | 57.95 | 39.45 |
| D3 | 953K | 409 × 180 | 73566 | 2106 | 111.93 | 90.38 | 76.23 | 58.60 | 42.10 |
| D4 | 1030K | 520 × 180 | 93563 | 6219 | 138.40 | 121.91 | 105.82 | 76.22 | 54.22 |
| D5 | 1017K | 530 × 180 | 95335 | 2560 | 116.92 | 99.25 | 84.63 | 66.00 | 50.77 |
| D6 | 1307K | 554 × 180 | 99584 | 1561 | 77.69 | 75.08 | 70.58 | 59.11 | 48.56 |
| D7 | 1595K | 578 × 180 | 103960 | 1963 | 38.07 | 42.90 | 41.04 | 37.46 | 32.24 |
| D8 | 1262K | 639 × 180 | 114971 | 3760 | 148.71 | 132.90 | 121.24 | 88.75 | 62.04 |
| D9 | 1427K | 749 × 180 | 134813 | 2400 | 139.34 | 123.29 | 115.08 | 91.34 | 68.22 |
| D10 | 2982K | 1128 × 180 | 203037 | 5526 | 272.07 | 231.07 | 194.57 | 149.06 | 106.05 |
| D11 | 2786K | 1451 × 180 | 261033 | 742 | 40.76 | 34.56 | 36.67 | 37.87 | 37.29 |
| D12 | 1733K | 1452 × 180 | 261263 | 1676 | 120.14 | 128.68 | 112.79 | 110.82 | 99.84 |
| D13 | 4159K | 2947 × 180 | 530352 | 4373 | 1001.23 | 735.84 | 586.84 | 423.75 | 300.26 |
| #variables/tester cycles per test pattern |  |  |  |  | 432/216 | 612/204 | 792/198 | 1152/192 | 1692/188 |
| D14 | 6125K | 2096 × 360 | 754274 | 4502 | 32028 | 295.77 | 273.32 | 238.65 | 193.74 |
| D15 | 12.0M | 1460 × 720 | 1051106 | 5396 | 170.78 | 164.08 | 154.51 | 135.71 | 117.58 |
| Ave. | 2622K |  | 258762 | 3212 | 193.07 | 161.59 | 139.50 | 110.58 | 84.81 |

TABLE 2 shows experimental results based on APD(18, 4,18,2) for 15 large cores. The decompressor scheme includes 4 static and 2 dynamic segments configured as circular shift registers. Each of these segments defines a partition of scan cells of CUT into groups. Next, two pairs of static segments (register $R_1$) and one pair of dynamic segments (register $R_2$) receive static and dynamic seeds, respectively, from the tester using a 36-bit serial shift register. At the beginning of each pattern, a static seed is loaded into register $R_1$ and an initial dynamic seed is loaded into register $R_2$. A next dynamic seed is loaded into register $R_2$ as soon as the dynamic seed is stored in the serial shift register. The size of the serial shift register is 36 bits. The size of dynamic seeds is 36 bits and therefore can be loaded in one step, whereas the size of static seeds is 72 bits and can be loaded in two steps. The number of shift cycles for reloading a new seed in the serial shift register depends on the number of streaming tester channels. As a result, the total number of tester cycles required per test pattern is 6n/s+l where n is the length of each segment, s is the number of streaming tester channels and l is the length of scan chains. Scope of static seeds is 1 shift cycle (or one pattern) and scope of dynamic seeds is 2n/s shift cycles. For most cores, the length of scan chains 180 is selected. The experimental results include: the number of gates, the number of scan chains, the number of scan cells, the number of test patterns without test compression, and TDVR/TART for each core when s—the number of streaming tester channels—varies from 2 to 9. Also, last row shows the number of variables and the number of required tester cycles per test pattern. In most of the cases, the level of compression has a minor, medium or significant impact on the number of patterns (pattern inflation). For example, the pattern inflation for outliers/exceptions D2, D7, D11 and D12 is 0, 521, 1382 and 403 percent, respectively. An average pattern inflation for the remaining cases (other than D2, D7, D11 and D12) for s=2 (highest level of compression) is 117 percent. An average pattern inflation for these remaining cases for s=9 (lowest level of compression) is 14 percent. In 11 out of 15 cores, TDVR/TATR exceeds 100×. An average TDVR/TATR for all cores varies between 193× and 85× depending on the level of compression (the number of streaming tester channels). These experimental results demonstrate that the described dynamic encoding algorithm provides a mechanism for efficient dynamic test pattern compaction and aggressive test data compression resulting in a significant TDVR/TATR (up to 1001×).

Figure 18:
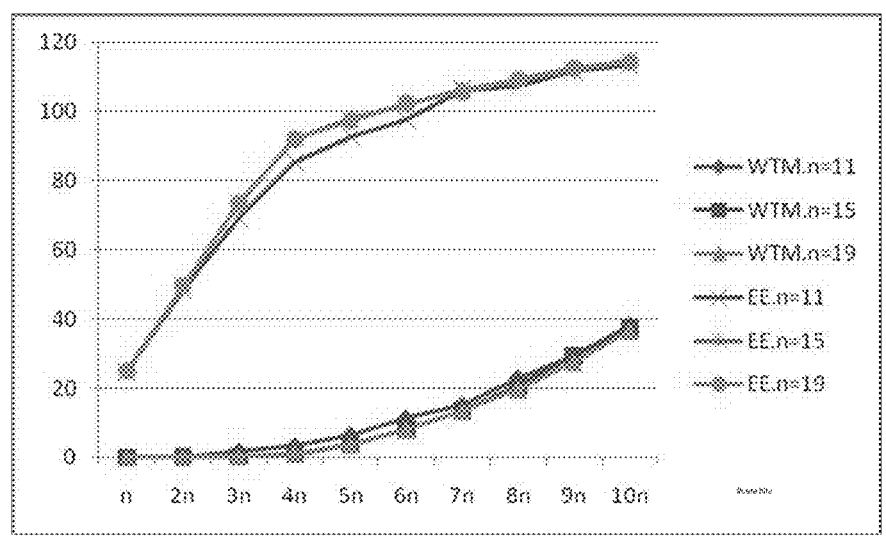
FIG. 18 is a graph of WTM and encoding ratio for the APD(n,4,2,2).

FIG. 18 shows the WTM and the encoding ratio of the APD(n,4,2,2) as a function of the number of UCBs for a scan configuration $n^3 \times 4n$ where n={11,15,19}. Scheme A2 shown in FIG. 17 is used for this experiment based on four streaming tester channels: two streaming tester channels for dynamic seeds, one streaming tester channel for loading static seeds into the serial shift register and one streaming tester channel for the control sequence. As a result, the APD receives 4n static and up to 8n dynamic variables per test pattern. The WTM is below 10 percent in an interval from 0 to 6n UCBs since all static and most dynamic care bits are successfully encoded based on static variables only. The number of successfully encoded care bits exceeds the number of required variables from the tester in an interval from 6n to 10n UCBs. The following observations can be made based on this experiment: 1) less than 50 percent of dynamic seeds are needed to keep the WTM below 20 percent; and 2) increasing the ratio between static and dynamic seeds as well as the size of dynamic seeds may further reduce the WTM when needed. Dynamic seeds result in switching in the decompressed test stimulus. Therefore, one way to reduce toggling is to reduce the number of dynamic seeds. To take advantage of this fact, dynamic seeds can be shared across multiple APD units. Other approaches include 1) using more than one static seed per pattern or 2) increasing the size of dynamic seeds.

TABLE 3

Splitting dynamic seeds between two cores for APD(n, 4 2, 2) for Scenario 1

| Core | n = 11 | | n = 13 | | n = 15 | | n = 17 | | n = 19 | |
|---|---|---|---|---|---|---|---|---|---|---|
| | #UCBs | WTM, % | #UCBs | WTM, % | #UCBs | WTM, % | #UCBs | WTM, % | #UCBs | WTM, % |
| 1 | 88.00 | 20.05 | 104.00 | 19.75 | 120.00 | 18.63 | 136.00 | 18.83 | 152.00 | 19.36 |
| 2 | 86.58 | 23.82 | 100.19 | 25.40 | 111.13 | 23.79 | 135.82 | 25.81 | 150.19 | 26.50 |
| Ave. | 87.29 | 21.94 | 102.10 | 22.58 | 115.57 | 21.21 | 135.91 | 22.32 | 151.10 | 22.93 |

TABLE 4

Splitting dynamic seeds between two cores for APD(n, 4, 2, 2) for Scenario 2

| Core | n = 11 | | n = 13 | | n = 15 | | n = 17 | | n = 19 | |
|---|---|---|---|---|---|---|---|---|---|---|
| | #UCBs | WTM, % | #UCBs | WTM, % | #UCBs | WTM, % | #UCBs | WTM, % | #UCBs | WTM, % |
| 1 | 120.62 | 42.28 | 140.45 | 41.91 | 163.45 | 41.95 | 185.11 | 41.16 | 206.57 | 42.10 |
| 2 | 74.87 | 17.80 | 92.96 | 14.79 | 108.19 | 18.40 | 121.67 | 18.76 | 128.08 | 17.44 |
| Ave. | 97.75 | 30.04 | 116.71 | 28.35 | 135.82 | 30.18 | 153.39 | 29.96 | 167.33 | 29.77 |

TABLES 3 and 4 show experimental data for splitting dynamic seeds between two APD(n,4,2,2) units coupled to two cores having $n^3$ scan chains of length 4n for Scenarios 1 and 2 discussed in Example 10. Scheme A2 shown in FIG. 17 is used for this experiment based on five streaming tester channels: two streaming tester channels for dynamic seeds, one streaming tester channel for loading static seeds into the serial shift register of each APD unit and one streaming tester channel for the control sequence. The numbers of static and dynamic variables are 8n and 8n, respectively. For n=11, the number of deployed variables is 176 while the total number of successfully encoded UCBs for both cores is 195.49 (129.62 for the first core and 74.87 for the second core) for Scenario 2. Average encoding ratio is 0.99 and 1.12 for Scenarios 1 and 2, respectively. The WTM varies between 18.63 and 26.50 percent for Scenario 1 as well as between 14.79 and 42.28 for Scenario 2. Under the assumption that one control bit is required per shift cycle, an average encoding efficiency is 0.79 and 0.89 for Scenarios 1 and 2, respectively. Note that the described experimental setup and examples are intended to illustrate certain advantageous features of the present technology. In this sense, the calculated encoding efficiency may be too conservative since the described experimental setup does not include: 1) an impact of the constrained encoding; 2) an impact of dynamic encoding; 3) an impact of splitting and sharing of seeds between multiple cores on TDVR and WTM; 4) various solutions for reducing control data from the tester by modifying and combining one or more schemes discussed in Example 10; and 5) the potential negative impact of ATPG on the encoding efficiency. For example, based on Table V in Janusz Rajski et. al, "Embedded Deterministic Test" published in IEEE Transactions on Computer-Aided Design, vol. 23, no. 5, pp. 776-792, May 2004, the encoding efficiency of Embedded Deterministic Test (EDT) is in the range of 0.76 and 0.99. Based on Table II in G. Mrugalski et. al, "Compression Based on Deterministic Test Vector Clustering of incompatible test cubes," Proc. IEEE Int. Test Conf., paper 9.2, 2009, an average encoding efficiency of EDT during ATPG is 0.53. Advantageous features of the present technology include dynamic encoding, seed splitting and sharing which provide efficient mechanisms for reducing the negative impact of ATPG on the encoding efficiency.

In summary, presented embodiments and experimental data demonstrated that the APD allows early identification of encoding conflicts during branch-and-bound ATPG search. In addition, the APD supports an efficient routing of the streaming test data across multiple units of decompressor circuitry, efficient dynamic test pattern compaction and aggressive test data compression while meeting the WTM requirements. These features are advantageous and provide efficient mechanisms for improving TDVR, TATR and WTM for on-chip test data compression of integrated circuits.

Figure 19A:
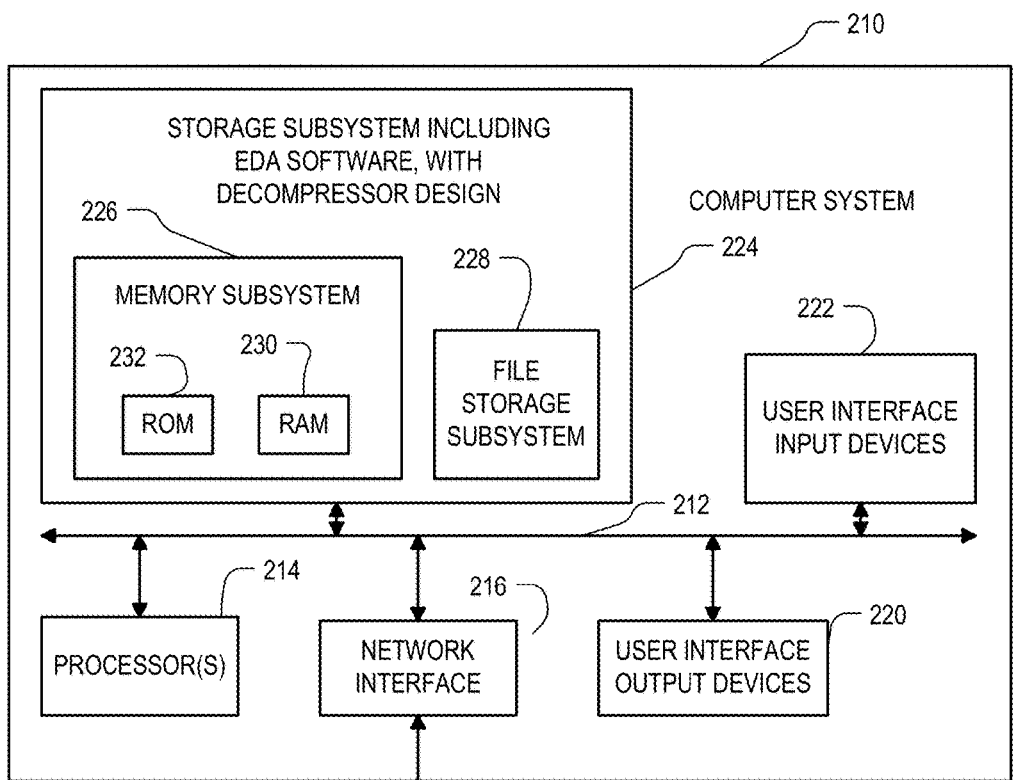
FIGS. 19(a)-(c) show a computer, non-transitory memory, and integrated circuit with embodiments of the technology.

FIG. 19A is a simplified block diagram of a computer system 1910 that can be used to implement any of the methods and processes herein, including a data processing system arranged as an electronic design automation system implementing the power-aware decompressor described herein.

Computer system 1910 typically includes a processor subsystem 1914 which communicates with a number of peripheral devices via bus subsystem 1912. These peripheral devices may include a storage subsystem 1924, comprising a memory subsystem 1926 and a file storage subsystem 1928, user interface input devices 1922, user interface output devices 1920, and a network interface subsystem 1916. The input and output devices allow user interaction with computer system 1910. Network interface subsystem 1916 provides an interface to outside networks, including an interface to communication network 1918, and is coupled via communication network 1918 to corresponding interface devices in other computer systems. Communication network 1918 may comprise many interconnected computer systems and communication links. These communication links may be wireline links, optical links, wireless links, or any other mechanisms for communication of information, but typically it is an IP-based communication network. While in one embodiment, communication network 1918 is the Internet, in other embodiments, communication network 1918 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1922 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1910 or onto computer network 1918.

User interface output devices 1920 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 1910 to the user or to another machine or computer system.

Storage subsystem 1924 stores the basic programming and data constructs that provide the functionality of certain embodiments of the present invention. For example, the various modules implementing the functionality of certain embodiments of the invention may be stored in storage subsystem 1924. These software modules are generally executed by processor subsystem 1914.

The software modules in a representative electronic design automation system includes logic design tools, design verification tools, synthesis tools, placement tools, routing tools, physical verification tools, test pattern generation and diagnostic tools and so on. The resources include a power-aware decompressor synthesis tool as described herein. In addition, the recourses include a test pattern generation tool comprising the 2-phase encoding process as described herein.

The storage subsystem 1924 is typically used for storing machine-readable definitions of circuits, such as high-level description language descriptions, netlists, mask definitions and so on. Different power-aware decompressor designs are stored here.

Memory subsystem 1926 typically includes a number of memories including a main random access memory (RAM) 1930 for storage of instructions and data during program execution and a read only memory (ROM) 1932 in which fixed instructions are stored. File storage subsystem 1928 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1928. The host memory 1926 contains, among other things, computer instructions which, when executed by the processor subsystem 1914, cause the computer system to operate or perform functions as described herein. As used herein, processes and software that are said to run in or on "the host" or "the computer", execute on the processor subsystem 1914 in response to computer instructions and data in the host memory subsystem 1926 including any other local or remote storage for such instructions and data.

Bus subsystem 1912 provides a mechanism for letting the various components and subsystems of computer system 1910 communicate with each other as intended. Although bus subsystem 1912 is shown schematically as a single bus, alternative embodiments of the bus subsystem may use multiple busses.

Computer system 1910 itself can be of varying types including a personal computer, a portable computer, a workstation, a computer terminal, a network computer, a television, a mainframe, a server farm, networks of computers utilized by designers of integrated circuits, or any other data processing system or user device. Due to the ever changing nature of computers and networks, the description of computer system 1910 depicted in FIG. 19 is intended only as a specific example for purposes of illustrating the preferred embodiments of the present invention. Many other configurations of computer system 1910 are possible having more or less components than the computer system depicted in FIG. 19.

Figure 19B:
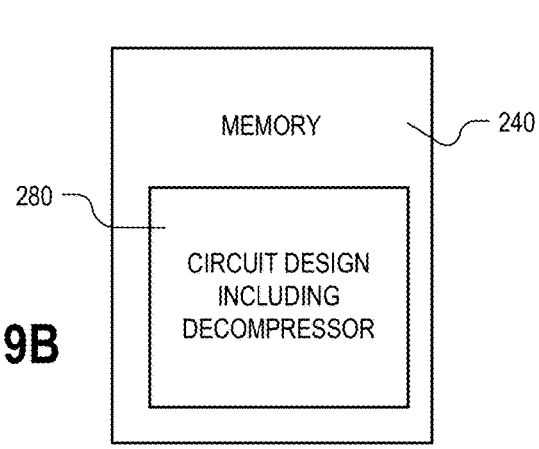

FIG. 19B is a simplified block diagram of a nontransitory memory 240 that stores programs that can be used to implement any of the methods and processes herein, implementing the power-aware decompressor described herein.

Figure 19C:
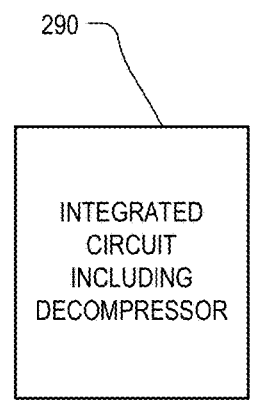

FIG. 19C is a simplified block diagram of an integrated circuit made according to any of the methods and processes herein, including power-aware decompressor described herein.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term does not include mere time varying signals in which the information is encoded in the way the signal varies over time.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term does not include mere time varying signals in which the information is encoded in the way the signal varies over time.

Overall Design Process Flow

Figure 20:
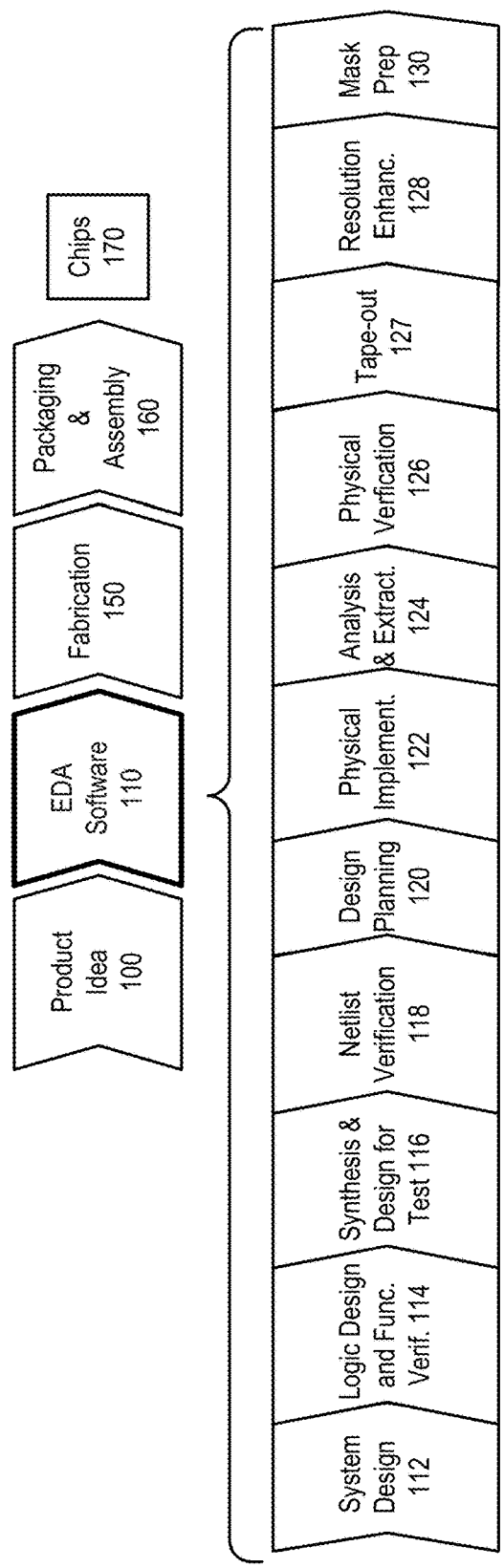
FIG. 20 is an example EDA process flow.

Aspects of the invention can be used to support an integrated circuit design flow. FIG. 20 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes (step 160) occur resulting, ultimately, in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces correct output response to particular input stimulus. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS® family of products.

Parallel flow. The integrated circuit manufacturing flow includes a parallel flow, as follows:

(1) Develop individual process steps for manufacturing the integrated circuit. This can be modeled with EDA tools such as the Synopsys tools "Sentaurus Process", "Sentaurus Topography", and "Sentaurus Lithography". The input information here is the process conditions like temperature, reactor ambient, implant energy, etc. The output information is the change in geometry or doping profiles or stress distribution.

(2) Integrate the individual process steps into the complete process flow. This can be modeled with EDA tools such as the Synopsys tool "Sentaurus Process". The input information here is the collection of the process steps in the appropriate sequence. The output is the geometry, the doping profiles, and the stress distribution for the transistors and the space in between the transistors.

(3) Analyze performance of the transistor manufactured with this process flow. This can be done with EDA tools such as the Synopsys tool "Sentaurus Device". The input information here is the output of step (3) and the biases applied to transistor terminals. The output information is the currents and capacitances for each bias combination.

(4) If necessary, modify the process steps and the process flow to achieve the desired transistor performance. This can be done iteratively by using tools such as the Synopsys tools mentioned above.

Once the process flow is ready, it can be used for manufacturing multiple circuit designs coming from different fabless companies. The EDA flow 112-130 will be used by such fabless companies. The parallel flow described here is used at a foundry to develop a process flow that can be used to manufacture designs coming from their fabless customers. A combination of the process flow and the masks 130 are used to manufacture any particular circuit. If the integrated circuit is manufactured at an IDM (integrated device manufacturer) company instead of the combination of a fables company and a foundry, then both parallel flows described above are done at the same IDM company.

There is also a bridge between these tools and the 112-130 EDA tools. The bridge can be an EDA tool a Synopsys tool "Seismos" that applies compact proximity models for particular circuit design and layout to obtain netlist with instance parameters for each individual transistor in the circuit as a function of its neighborhood and stress, including material conversion stress.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An apparatus, comprising:
   an integrated circuit (IC) including decompressor circuitry receiving static variable data originating from a tester for a plurality of static variables and dynamic variable data originating from the tester for a plurality of dynamic variables, the decompressor circuitry decompressing the static variable data and the dynamic variable data into a decompressed test stimulus, and loading the decompressed test stimulus into scan chains of a circuit under test (CUT) in a plurality of shift cycles to detect defects in the CUT, the plurality of shift cycles including a higher number of shift cycles for the static variable data originating from the tester for the plurality of static variables than for the dynamic variable data originating from the tester for the plurality of dynamic variables, the decompressor circuitry comprising:
   a first segment and a second segment each comprising memory elements (MEs) and (i) said first segment receives the static variable data originating from the tester for the plurality of static variables, and (ii) and said second segment receives the dynamic variable data originating from the tester for the plurality of dynamic variables; and
   a purely combinational logic network coupling (i) the scan chains of the CUT to (ii) said first segment and said second segment, the logic network generating to the scan chains of the CUT combinations of the plurality of static variables from the first segment and the plurality of dynamic variables from the second segment wherein the plurality of dynamic variables in the second segment divides scan cells in the scan chains of the CUT into groups such that (i) changing a value of a particular one of said plurality of dynamic variables in the second segment changes a subset of bits in the decompressed test stimulus, the subset of bits being loaded into a particular one of the groups of scan cells of the CUT; and (ii) none of the scan cells is shared among the groups.

2. The apparatus of claim 1, wherein said logic network of the decompressor circuitry comprises a set of XOR gates such that each of the scan chains of the CUT is coupled to an XOR gate of the set of XOR gates and said XOR gate receives input from at least one ME of said first segment and at least one ME of said second segment of the decompressor circuitry.

3. The apparatus of claim 1, wherein said first segment of the decompressor circuitry is configured to periodically receive said static variable data from the tester and said second segment of the decompressor circuitry is configured to selectively receive said dynamic variable data from the tester.

4. The apparatus of claim 1, wherein said first segment of the decompressor circuitry receives said static variable data from the tester via a serial shift register coupled to the tester via one or more streaming tester channels.

5. The apparatus of claim 1, wherein a pair of the MEs of said second segment of the decompressor circuitry receives a same one element of said dynamic variable data from the tester.

6. The apparatus of claim 1, wherein said second segment of the decompressor circuitry is configured to hold the dynamic variable data from the tester for two or more shift cycles such that the MEs of said second segment contain the same dynamic variable data from the tester for two or more shift cycles.

7. The apparatus of claim 1, wherein (i) the first segment, during at least the static scope, receives the static variable data originating from the tester preferentially over the dynamic variables originating from the tester, and (ii) said second segment, during at least the dynamic scope, receives the dynamic variable data originating from the tester preferentially over the static variable data originating from the tester.

8. The apparatus of claim 7, where said dynamic variables are associated with one or more partitions such that (i) each of the dynamic variables is uniquely associated with a group of scan cells in one of said partitions; and (ii) one of the partitions is associated with the second segment of the decompressor circuitry such that (ii.a) the dynamic variable data of said one of the partitions is loaded into the MEs of said second segment of the decompressor circuitry; and (ii.b) the MEs respectively contain dynamic variable data for one of the dynamic variables.

9. The apparatus of claim 1, wherein said second segment of the decompressor circuitry is a circular shift register such that each ME receives data for one of the dynamic variables from a preceding ME and supplies data for one of the dynamic variables received to a following ME.

10. The apparatus of claim 1, wherein the plurality of dynamic variables said second segment of the decompressor circuitry divides the scan cells of the CUT into groups such that each of the scan cells of the CUT belong to one of the groups.

11. An electronic design automation (EDA) tool comprising:
   a memory; and
   a data processor coupled to the memory, the memory containing software code portions which, when executed by the data processor, define an integrated circuit (IC) including decompressor circuitry receiving static variable data originating from a tester for a plurality of static variables and dynamic variable data originating from the tester for a plurality of dynamic variables,
   the decompressor circuitry decompressing the static variable data and the dynamic variable data into a decompressed test stimulus, and loading the decompressed test stimulus into scan chains of a circuit under test (CUT) in a plurality of shift cycles to detect defects in the CUT, the plurality of shift cycles including a higher number of shift cycles for the static variable data originating from the tester for the plurality of static variables than for the dynamic variable data originating from the tester for the plurality of dynamic, the decompressor circuitry comprising:
      a first segment and a second segment each comprising memory elements (MEs) and (i) said first segment receives the static variable data originating from the tester for the plurality of static variables, and (ii) and said second segment receives the dynamic variable data originating from the tester for the plurality of dynamic variables; and
      a purely combinational logic network coupling (i) the scan chains of the CUT to (ii) said first segment and said second segment, the logic network generating to the scan chains of the CUT combinations of the plurality of static variables from the first segment and the plurality of dynamic variables from the second segment wherein the plurality of dynamic variables in the second segment divides scan cells in the scan chains of the CUT into groups such that (i) changing a value of a particular one of said plurality of dynamic variables in the second segment changes a subset of bits in the decompressed test stimulus, the subset of bits being loaded into a particular one of the groups of scan cells of the CUT; and (ii) none of the scan cells is shared among the groups.

12. The computer readable medium of claim 11, wherein said logic network of the decompressor circuitry comprises a set of XOR gates such that each of the scan chains of the CUT is coupled to an XOR gate of the set of XOR gates and said XOR gate receives input from at least one ME of said first segment and at least one ME of said second segment of the decompressor circuitry.

13. The computer readable medium of claim 11, wherein said first segment of the decompressor circuitry is configured to periodically receive said static variable data from the tester and said second segment of the decompressor circuitry is configured to selectively receive said dynamic variable data from the tester.

14. The computer readable medium of claim 11, wherein said first segment of the decompressor circuitry receives said static variable data from the tester via a serial shift register coupled to the tester via one or more streaming tester channels.

15. The computer readable medium of claim 11, wherein a pair of the MEs of said second segment of the decompressor circuitry receives a same one element of said dynamic variable data from the tester.

16. The computer readable medium of claim 11, wherein said second segment of the decompressor circuitry is configured to hold the dynamic variable data from the tester for two or more shift cycles such that the MEs of said second segment contain the same dynamic variable data from the tester for two or more shift cycles.

17. The computer readable medium of claim 11, wherein (i) the first segment, during at least the static scope, receives the static variable data originating from the tester preferentially over the dynamic variables originating from the tester, and (ii) said second segment, during at least the dynamic scope, receives the dynamic variable data originating from the tester preferentially over the static variable data originating from the tester.

18. The computer readable medium of claim 17, where said dynamic variables are associated with one or more partitions such that (i) each of the dynamic variables is uniquely associated with a group of scan cells in one of said partitions; and (ii) one of the partitions is associated with the second segment of the decompressor circuitry such that (ii.a) the dynamic variable data of said one of the partitions is loaded into the MEs of said second segment of the decompressor circuitry; and (ii.b) the MEs respectively contain dynamic variable data for one of the dynamic variables.

19. The computer readable medium of claim 11, wherein said second segment of the decompressor circuitry is a circular shift register such that each ME receives data for one of the dynamic variables from a preceding ME and supplies data for one of the dynamic variables received to a following ME.

20. The computer readable medium of claim 11, wherein the plurality of dynamic variables said second segment of the decompressor circuitry divides the scan cells of the CUT into groups such that each of the scan cells of the CUT belong to one of the groups.

21. A method, comprising:
   providing an integrated circuit device including a circuit under test (CUT) and decompressor circuitry for the CUT;
   coupling a tester system to the decompressor circuitry of the integrated circuit device, the tester system providing static variable data and dynamic variable data to the decompressor circuitry;
   the decompressor circuitry being structured to decompress the static variable data and the dynamic variable data to generate care bits into test patterns each comprising a plurality of static variables and a plurality of dynamic variables, the decompressor circuitry loading the care bits into scan cells of the CUT in a plurality of shift cycles; and
   the tester system receiving output data generated by the integrated circuit device in response to the test patterns, and using the output data to detect defects in the CUT,
   wherein the care bits are divided into static care bits and dynamic care bits, such that (i) encoding of the static care bits is based on the plurality of static variables; and (ii) encoding of the dynamic care bits is preferentially based on the plurality of dynamic variables over the plurality of static variables,
wherein the plurality of static variables lasts more shift cycles of the plurality of shift cycles than the plurality of dynamic variables.

22. The method of claim 21, further comprising:
including, by a computer system, a design for the decompressor circuitry in an integrated circuit design which includes a design for the CUT; and
fabricating the integrated circuit device in accordance with the integrated circuit design and the decompressor circuitry design.

23. The method of claim 21, wherein each of the dynamic care bits uniquely maps to one of the dynamic variables.

24. The method of claim 21, wherein said care bits loaded into the scan cells of the CUT target a fault detection of a fault in the CUT, the static care bits are encoded during test generation of said fault in the CUT and the dynamic care bits are encoded after test generation for said fault in the CUT is completed.

25. The method of claim 21, wherein the care bits are associated with corresponding characteristic equations including a unique combination of said plurality of static variables and said plurality of dynamic variables and wherein said method for encoding is based on a system of linear equations comprising one augmented characteristic equation for each of the static care bits wherein said augmented characteristic equation is calculated by superposition of the corresponding characteristic equations of said each of the static care bits and one or more of the dynamic care bits.

26. The method of claim 25, wherein each of said augmented characteristic equations includes one or more of the static variables.

27. The method of claim 21, wherein the care bits of the decompressed test patterns are divided into classes such that (i) each class of the care bits contains at most one dynamic care bit; and (ii) each of the dynamic care bits is uniquely associated with one of the dynamic variables.

28. The method of claim 27, where said classes of the care bits are associated with one or more partitions of the dynamic variables such that (i) the dynamic variables are associated respectively with one of said partitions; (ii) the classes are associated respectively with at most one of the dynamic variables of each of the partitions; and (iii) the dynamic variables of respective ones of the partitions is loaded into a segment of memory elements (MEs) of a decompressor circuitry such that said MEs respectively contain one of the dynamic variables.

29. The method of claim 21, wherein said dynamic variables from the tester are loaded in MEs of a decompressor circuitry such that each of said MEs of the decompressor circuitry always contains one of the dynamic variables.

30. The method of claim 21, further comprising control variables of said test pattern wherein each of said control variables is uniquely mapped to: (i) a group of scan cells of the CUT, (ii) one of the dynamic variables and (iii) a set of test patterns such that each of said control variables disables said one of the dynamic variables for said group of scan cells of the CUT and said set of test patterns.

31. The method of claim 21, wherein said encoding of the care bits is incorporated into an automatic test pattern generation (ATPG) implication process.

32. The method of claim 22, wherein each of the dynamic care bits uniquely maps to one of the dynamic variables.

33. The method of claim 22, wherein said care bits loaded into the scan cells of the CUT target a fault detection of a fault in the CUT, the static care bits are encoded during test generation of said fault in the CUT and the dynamic care bits are encoded after test generation for said fault in the CUT is completed.

34. The method of claim 22, wherein the care bits are associated with corresponding characteristic equations including a unique combination of said plurality of static variables and said plurality of dynamic variables and wherein said method for encoding is based on a system of linear equations comprising one augmented characteristic equation for each of the static care bits wherein said augmented characteristic equation is calculated by superposition of the corresponding characteristic equations of said each of the static care bits and one or more of the dynamic care bits.

35. The method of claim 34, wherein each of said augmented characteristic equations includes one or more of the static variables.

36. The method of claim 22, wherein the care bits of the decompressed test patterns are divided into classes such that (i) each class of the care bits contains at most one dynamic care bit; and (ii) each of the dynamic care bits is uniquely associated with one of the dynamic variables.

37. The method of claim 36, where said classes of the care bits are associated with one or more partitions of the dynamic variables such that (i) the dynamic variables are associated respectively with one of said partitions; (ii) the classes are associated respectively with at most one of the dynamic variables of each of the partitions; and (iii) the dynamic variables of respective ones of the partitions is loaded into a segment of memory elements (MEs) of a decompressor circuitry such that said MEs respectively contain one of the dynamic variables.

38. The method of claim 22, wherein said dynamic variables from the tester are loaded in MEs of a decompressor circuitry such that each of said MEs of the decompressor circuitry always contains one of the dynamic variables.

39. The method of claim 22, further comprising control variables of said test pattern wherein each of said control variables is uniquely mapped to: (i) a group of scan cells of the CUT, (ii) one of the dynamic variables and (iii) a set of test patterns such that each of said control variables disables said one of the dynamic variables for said group of scan cells of the CUT and said set of test patterns.

40. The method of claim 22, wherein said encoding of the care bits is incorporated into an automatic test pattern generation (ATPG) implication process.

* * * * *